United States Patent
Iwaki et al.

(10) Patent No.: US 8,125,297 B2
(45) Date of Patent: Feb. 28, 2012

(54) FILTER, DUPLEXER, AND COMMUNICATION APPARATUS

(75) Inventors: Masafumi Iwaki, Kawasaki (JP);
Tokihiro Nishihara, Kawasaki (JP);
Shinji Taniguchi, Kawasaki (JP);
Takeshi Sakashita, Kawasaki (JP);
Tsuyoshi Yokoyama, Kawasaki (JP);
Motoaki Hara, Kawasaki (JP);
Masanori Ueda, Kawasaki (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 356 days.

(21) Appl. No.: 12/512,794

(22) Filed: Jul. 30, 2009

(65) Prior Publication Data

US 2010/0026414 A1    Feb. 4, 2010

(30) Foreign Application Priority Data

Jul. 31, 2008    (JP) .................................. 2008-198432

(51) Int. Cl.
*H03H 9/70* (2006.01)
*H03H 9/54* (2006.01)
*H03H 9/64* (2006.01)
*H03H 9/72* (2006.01)

(52) U.S. Cl. ..................... 333/133; 333/189; 333/193

(58) Field of Classification Search ................. 333/133, 333/189, 191–196
See application file for complete search history.

(56) References Cited

U.S. PATENT DOCUMENTS

| | | | |
|---|---|---|---|
| 6,535,080 B2 * | 3/2003 | Taniguchi | 333/193 |
| 6,542,055 B1 | 4/2003 | Frank et al. | |
| 6,600,390 B2 * | 7/2003 | Frank | 333/189 |
| 6,919,777 B2 * | 7/2005 | Taniguchi et al. | 333/133 |
| 7,298,231 B2 * | 11/2007 | Ikuta et al. | 333/133 |
| 7,479,850 B2 * | 1/2009 | Kearns et al. | 333/189 |
| 2003/0112768 A1 * | 6/2003 | Frank | 370/281 |

FOREIGN PATENT DOCUMENTS

| | | |
|---|---|---|
| EP | 1 202 454 A2 | 5/2002 |
| JP | 11-346142 * | 12/1999 |
| JP | 2002-019876 A | 1/2002 |
| JP | 2002-198765 A | 7/2002 |

* cited by examiner

*Primary Examiner* — Barbara Summons
(74) *Attorney, Agent, or Firm* — Chen Yoshimura LLP

(57) ABSTRACT

A filter includes: a first filter unit includes: a series resonators connected in series to each other between a first input terminal and a first output terminal; a parallel resonators each having one end connected to one terminal of each of the series resonators; and a common inductance having one end connected to the other ends of the parallel resonators and the other end connected to a ground terminal, and a second filter unit includes: a series resonators connected in series to each other between a second input terminal and a second output terminal; a parallel resonators each having one end connected to one terminal of each of the series resonators; and a common inductance having one end connected to the other ends of the parallel resonators and the other end connected to the ground terminal.

13 Claims, 25 Drawing Sheets

FILTER, DUPLEXER, AND COMMUNICATION APPARATUS

CROSS-REFERENCE TO RELATED APPLICATIONS

This application is based upon and claims the benefit of priority of the prior Japanese Patent Application No. 2008-198432, filed on Jul. 31, 2008, the entire contents of which are incorporated herein by reference.

BACKGROUND

1. Field of the Invention

The present invention relates to a filter, a duplexer, a radio frequency module, and a communication apparatus used for wireless communication.

2. Description of Related Art

In recent years, a filter for radio frequency communication in which an antenna terminal functioning as an unbalanced port and a receiving terminal functioning as a balanced port has been required in order to prevent disturbance and improve reception sensitivity. For example, as the filter, a DMS (double-mode SAW) filter using a SAW (surface acoustic wave) device has been used.

In addition, there is a balanced-unbalanced duplexer without using the DMS filter. JP-A-2002-198765 discloses a balanced-unbalanced duplexer obtained by combining a balun (impedance conversion circuit) with an unbalanced ladder filter. As illustrated in FIG. 17, in the balanced-unbalanced duplexer, a balanced input/output receiving filter 81 is connected to a balun 71. The balanced input/output receiving filter 81 is a 4-terminal filter including two filters. In the balanced-unbalanced duplexer, the balun 71 is connected to two terminals (an input 1 and an input 2) of the 4-terminal filter. The balun 71 and a transmitting filter 61 are connected to an antenna terminal Ant.

FIG. 18 is a diagram illustrating the balun 71 and the balanced input/output receiving filter 81. The balance input/output receiving filter 81 illustrated in FIG. 18 includes two ladder filters that share parallel resonators P1 to P4 and do not have a connection point connected to the ground. This circuit is referred to as a full ladder circuit.

FIG. 19 is a diagram illustrating the balanced input/output receiving filter 81. In the balanced input/output receiving filter 81 illustrated in FIG. 19, two ladder filters 82 and 83 are symmetrically arranged. Parallel resonators L1-P1 to L1-P4 and parallel resonators L2-P1 to L2-P4 are connected to the ground, similar to an unbalanced filter. This circuit is referred to as a half ladder circuit.

In both the full ladder circuit and the half ladder circuit, there is a phase angle difference of 180° between channels 1 and 2 in a reception (Rx) band (the phases are opposite to each other). That is, these circuits are unbalanced-balanced output filters. However, when these circuits are actually used, the following problems may arise. FIG. 20A is a graph illustrating transmission characteristics between a transmitting terminal Tx and an antenna terminal Ant. and between the antenna terminal Ant. and a receiving terminal Rx of the full ladder circuit illustrated in FIG. 18. FIG. 20B is a graph illustrating isolation characteristics between the transmitting terminal Tx and the receiving terminal Rx. FIGS. 21A and 21B are graphs the illustrating transmission characteristics and isolation characteristics, as described above, of the half ladder circuit illustrated in FIG. 19. As may be seen from these graphs, in both the full ladder circuit and the half ladder circuit, the attenuation and isolation characteristics of the receiving filter in a transmission band rapidly decrease in the vicinity of a reception band and then increase thereafter. Therefore, good attenuation and isolation characteristics are not obtained in the opposite band. In general, the receiving filter requires an attenuation and isolation of about 44 to 55 dB or more in the opposite band. It is difficult for the circuit illustrated in FIGS. 18 and 19 to satisfy this performance. In addition, it is generally difficult for the full ladder circuit to remove a common mode.

In order to solve these problems, JP-A-2002-198765 discloses an aspect in which an inductance is connected to one end of each parallel resonator and the other end of the inductance is connected to the ground.

SUMMARY

According to an aspect of the invention, a filter includes: a first filter unit, and a second filter unit. The filter provides that the first filter unit includes: a plurality of series resonators that are connected in series to each other between a first input terminal and a first output terminal, a plurality of parallel resonators each having one end connected to one terminal of each of the plurality of series resonators, and a common inductance having one end connected to the other ends of at least two of the plurality of parallel resonators and the other end connected to a ground terminal. The filter further provides that the second filter unit includes: a plurality of series resonators that are connected in series to each other between a second input terminal and a second output terminal, a plurality of parallel resonators each having one end connected to one terminal of each of the plurality of series resonators, and a common inductance having one end connected to the other ends of at least two of the plurality of parallel resonators and the other end connected to the ground terminal.

The object and advantages of the invention will be realized and attained by means of the elements and combinations particularly pointed out in the claims.

It is to be understood that both the foregoing general description and the following detailed description are exemplary and explanatory and are not restrictive of the embodiment, as claimed.

DETAILED DESCRIPTION OF THE PREFERRED EMBODIMENTS

Figure 1:
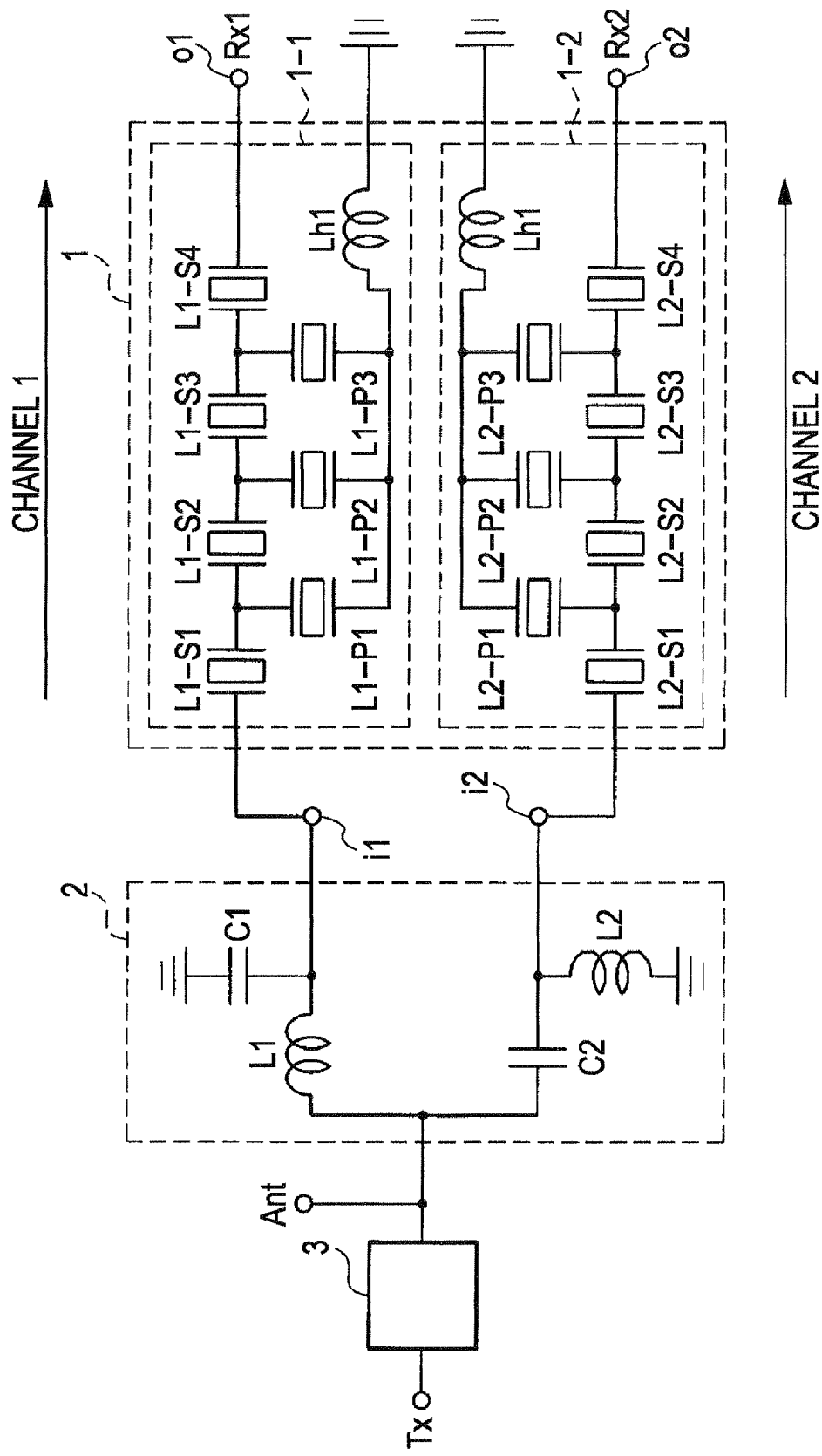
FIG. 1 is a circuit diagram illustrating a duplexer in accordance with aspects of the present invention.

In practice, it may be complicated and difficult to provide an inductance for each parallel resonator. There are various methods of providing an inductance for each parallel resonator to improve characteristics. However, it is difficult to reduce the size of a filter in all the methods. In addition, when a large number of inductances are arranged adjacent to each other, characteristics may be lowered due to electromagnetic coupling between the inductances.

Objects of the invention include to improve the filter characteristics of a balanced input/output filter used for a balanced-unbalanced filter and to reduce the size of the filter. Thereby improving the filter characteristics (e.g. the attenuation, isolation, common mode attenuation, and balance characteristics) of the filter outside a pass band.

According to an aspect of the invention, a filter includes a first filter unit, a second filter unit, and inductances. The first filter unit includes a plurality of series resonators that are connected in series to each other between a first input terminal and a first output terminal and a plurality of parallel resonators that are connected in parallel to each other therebetween. The second filter unit includes a plurality of series resonators that are connected in series to each other between a second input terminal and a second output terminal and a plurality of parallel resonators that are connected in parallel to each other therebetween. In the first filter unit, one end of each of at least two parallel resonators is connected to one inductance. In the second filter unit, one end of each of at least two parallel resonators is connected to one inductance.

According to the above-mentioned circuit, in each of the first filter unit and the second filter unit, one end of each of at least two parallel resonators is connected to one inductance. As such, since one end of the at least one of parallel resonator is connected to the inductance, for example, the attenuation, isolation, common mode attenuation, and balance characteristics of the filter outside a pass band are improved. In addition, since a plurality of parallel resonators share one inductance, it is possible to reduce the size of a filter. As a result, it is possible to achieve a filter device having a small size and improved the filter characteristics.

According to the above-mentioned embodiment of the invention, it is possible to improve, for example, the attenuation, isolation, common mode attenuation, and balance characteristics, of a balanced input/output filter used for a balanced-unbalanced filter outside a pass band, and additionally to reduce the size of the filter.

In the above-mentioned embodiment of the invention, the filter may further include a balun that divides an input signal into two signals having opposite phases and outputs the two signals to the first input terminal and the second input terminal respectively. According to this aspect, it is possible to improve filter characteristics and reduce the size of a balanced-unbalanced filter.

The above-mentioned embodiment of the invention may have the following aspect. In the first filter unit, the plurality of parallel resonators are classified into at least two sets, and one inductance is connected to one end of each of the parallel resonators in each set. In the second filter unit, the plurality of parallel resonators are classified into at least two sets, and one inductance is connected to one end of each of the parallel resonators in each set.

According to the above-mentioned circuit, in each of the first filter unit and the second filter unit, an inherent inductance is connected to each set of the plurality of parallel resonators. In this way, it is possible to finely adjust filter characteristics, such as but not limited to, attenuation characteristics, outside a pass band.

The above-mentioned embodiment of the invention may have the following aspect. In the first filter unit, at least one parallel resonator may be connected to the parallel resonator of the second filter unit, or the first filter unit and the second filter unit may share at least one parallel resonator. In the first filter unit, one inductance is connected to one end of each of at least two resonators among the resonators other than the connected or shared resonator. In addition, in the second filter unit, one inductance is connected to one end of each of at least two resonators among the resonators other than the connected or shared resonator. According to this circuit, it is easy to reduce the size of a filter.

In the above-mentioned embodiment of the invention, the filter may further include a capacitance that is provided between the first input terminal of the first filter unit and the second output terminal of the second filter unit. In the above-mentioned embodiment of the invention, the filter may further include a capacitance that is provided between the first output terminal of the first filter unit and the second input terminal of the second filter unit. According to this aspect, it is possible to further improve filter characteristics.

The above-mentioned embodiment of the invention may further have the following aspect. In the first filter unit, one end of each of all the parallel resonators is connected to one inductance. In the second filter unit, one end of each of all the parallel resonators is connected to one inductance.

In each of the first filter unit and the second filter unit, one end of each of all the parallel resonators is connected to one inductance. Therefore, it is possible to further improve filter characteristics and it is easy to reduce the size of a filter.

The above-mentioned embodiment of the invention may have the following aspect. The series resonators and the parallel resonators of the first filter unit and the second filter unit are provided on a substrate. The inductances are formed by transmission lines provided on the substrate.

According to the above-mentioned circuit, for example, the inductances are formed by a conductor pattern provided on the substrate having the first filter unit and the second filter unit formed thereon. Therefore, it is possible to further reduce the size of a filter.

The above-mentioned embodiment of the invention may have the following aspect. The first filter unit and the second filter unit are formed in a package and the inductances are provided in the package.

According to the above-mentioned arrangement, for example, the inductances are formed in the package having the first filter unit and the second filter unit provided therein. Therefore, it is possible to further reduce the size of a filter.

In the above-mentioned embodiment of the invention, the balun may be a circuit using a concentrated constant.

In the above-mentioned embodiment of the invention, the parallel resonator and the series resonator may be surface acoustic wave (SAW) devices or film bulk acoustic resonators (FBARs).

Another embodiment of the invention may include a duplexer. The duplexer includes a receiving filter. A balun divides a signal input from a common terminal into two signals having opposite phases, and outputs the two signals to the first input terminal and the second input terminal of the receiving filter. The duplexer further includes a transmitting filter connected to the common terminal. In addition, the embodiment of the invention further includes a module or a communication apparatus including the filter.

FIG. 1 is a circuit diagram illustrating a duplexer including a balanced input/output filter. The duplexer includes a balanced-unbalanced converter 2 (hereinafter, referred to as a balun 2) and a receiving filter 1 and a transmitting filter 3, which are balanced input/output filters. An antenna terminal (common terminal) Ant, which is a single terminal (single end), is connected to the transmitting filter 3 and the balun 2. The balun 2 converts a single signal (transmission signal) input through the antenna terminal Ant into a balance signal, and outputs the converted signal. As such, the balun 2 includes one input terminal and two output terminals. The input terminal of the balun 2 is a single terminal, and the output terminals of the balun 2 are balanced terminals (e.g. an input i1 and an input i2).

The input i1 and the input i2 are balanced input terminals of the receiving filter 1, and an output o1 and an output o2 are balanced output terminals. That is, the receiving filter 1 passes the received signals in a reception frequency band, among the received signals (balanced signals) input from the input i1 and the input i2, and outputs the balanced signals from the output o1 and the output o2. Therefore, the output o1 and the output o2 of the duplexer are referred to as receiving terminals Rx1 and Rx2 of a receiving circuit.

Although not illustrated in the drawings, a phase matching circuit may be connected between the transmitting filter 3 and the balun 2. For example, such a phase matching circuit may adjust the phase of the impedance of the receiving filter 1 to prevent a transmission signal output from the transmitting filter 3 from being input to the receiving filter 1.

The balun 2 delays the phase of the signal input to the antenna terminal Ant by about 90° and outputs the signal to the input i1. In addition, the balun 2 leads the phase of the signal input to the antenna terminal Ant by about 90° and outputs the signal to the input i2. In the example illustrated in FIG. 1, the balun 2 includes inductors L1 and L2 and capacitors C1 and C2. The inductor L1 and the capacitor C2 are connected in series to a signal line. The inductor L2 and the capacitor C1 are connected between a signal line and the ground. The circuit of the balun 2 is not limited to the example illustrated in FIG. 1.

The receiving filter 1 is a 4-terminal filter. In the receiving filter 1, a ladder filter 1-1 (first filter unit) is connected between the input i1 and the output o1, and a ladder filter 1-2 (second filter unit) is connected between the input i2 and the output o2. The filter 1-1 includes series resonators L1-S1 to L1-S4 that are connected in series to each other between the input i1 and the output o1 and parallel resonators L1-P1 to L1-P3 that are connected in parallel between a line linking the input i1 and the output o1 and the ground. Similarly, the filter 1-2 includes series resonators L2-S1 to L2-S4 and parallel resonators L1-P1 to L1-P3. The filters are multi-stage ladder filters.

In the filter 1-1, the ground-side ends of the parallel resonators L1-P1 to L1-P3 are connected to one inherent inductance Lh1. That is, one end of each of the parallel resonators L1-P1 to L1-P3 is connected to the inherent inductance. Similarly, in the filter 2-1, the ground-side ends of the parallel resonators L2-P1 to L2-P3 are connected to one inherent inductance Lh2. The values of the inductances Lh1 and Lh2 are appropriately set according to characteristics required for the receiving filter 1.

Figure 2:
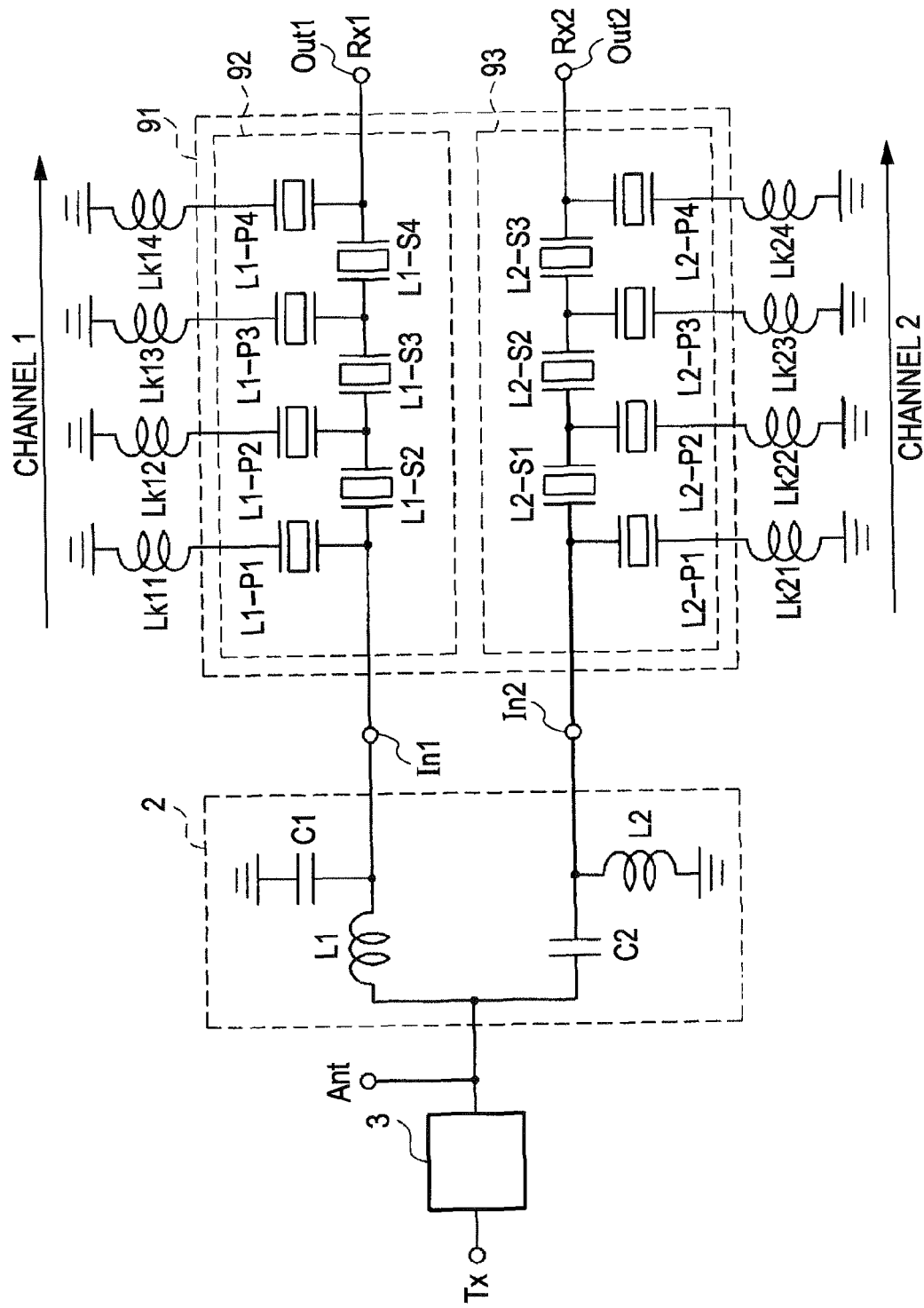
FIG. 2 is a circuit diagram illustrating a structure in which an inductance is provided for a parallel resonator in accordance with aspects of the present invention.

As such, the inductances provided between the parallel resonators L1-P1 to L1-P3 and L2-P1 to L2-P3 and the ground make it possible to improve filter characteristics of the receiving filter, such as but not limited to transmission band attenuation, common mode attenuation, and balance characteristics. FIG. 2 is a diagram illustrating a comparative example in accordance with aspects of the present invention. In the comparative example, inductances are provided for a plurality of parallel resonators. In a ladder filter 92 and a latter filter 93 provided in a receiving filter 91 illustrated in FIG. 2, one end of each of the parallel resonators L1-P1 to L1-P3 and L2-P1 to L2-P3 is connected to a corresponding one of the inductances Lk11 to 14 and 21 to 24. In the circuit, the filter characteristics are improved. However, the aspect illustrated in FIG. 1 in which one inductance is provided for a plurality of parallel resonators provides a smaller inductance than the aspect in which the inductances are individually provided for the parallel resonators. In addition, in this embodiment, there are fewer inductances. As a result, it is possible to reduce the size of a filter.

That is, as illustrated in FIG. 2, in practice is may be complicated and difficult to provide the inductance for each parallel resonator. In the case of the circuit illustrated in FIG. 2, it is considered that the value of the inductance provided for each parallel resonator is in the range of about 0.5 to 1.0 nH. Various methods may be used in order to implement the circuit. However, in any method, it is considered that the circuit has an outer size of 5 mm×5 mm or more. Therefore, the circuit illustrated in FIG. 2 may not be accommodated in a package having a size of 3 mm×3 mm or a size of 2.5 mm×2.0 mm, which may be preferable.

In contrast, in the circuit illustrated in FIG. 1, the value of the inductance to be provided is small, and there are fewer inductances. Therefore, it is possible to reduce the size of the duplexer illustrated in FIG. 1. For example, the duplexer is more likely to be accommodated in a package having a size of 3 mm×3 mm or a size of 2.5 mm×2.0 mm.

Figure 3A:
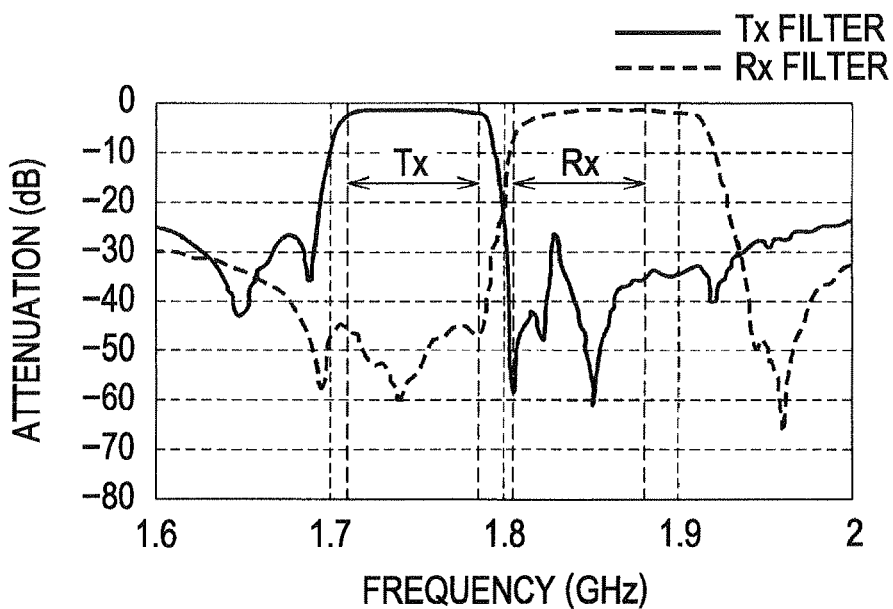
FIGS. 3A to 3D are graphs illustrating various characteristics of the duplexer in accordance with aspects of the present invention.
Figure 3B:
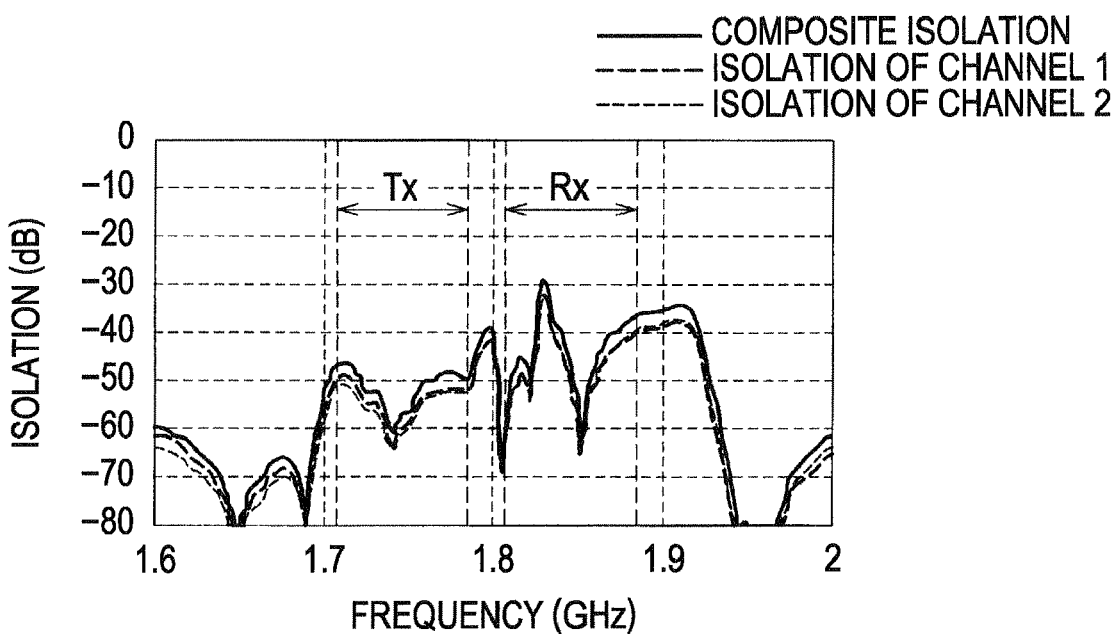
Figure 3C:
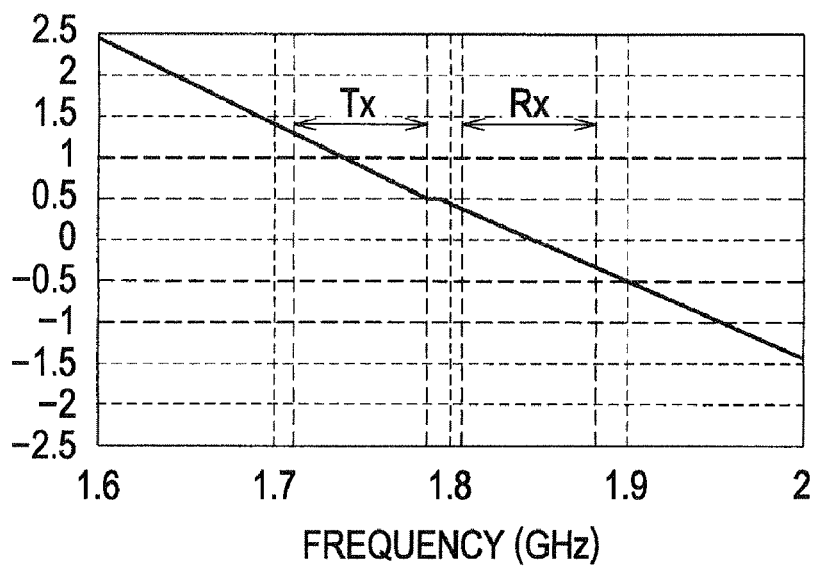
Figure 3D:
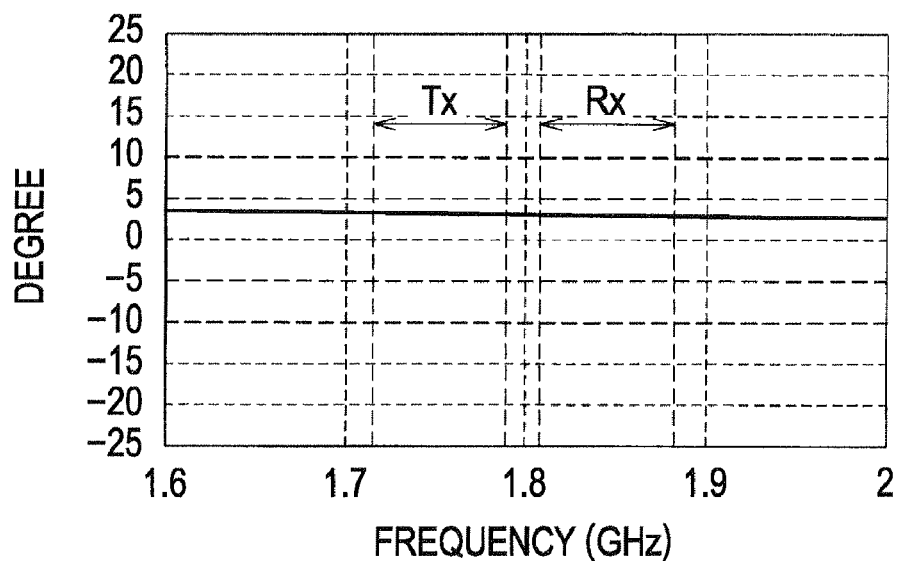

FIGS. 3A to 3D are graphs illustrating various characteristics of the duplexer illustrated in FIG. 1. FIG. 3A is a graph illustrating transmission characteristics (solid line) between the transmitting terminal Tx and the antenna terminal Ant of the duplexer illustrated in FIG. 1 and transmission characteristics (dashed line) between the antenna terminal Ant and receiving terminals Rx1 and Rx2. FIG. 3B is a graph illustrating isolation characteristics between the transmitting terminal Tx and the receiving terminals Rx1 and Rx2. In the graph illustrated in FIG. 3B, a dashed line indicates the isolation of channel 1 including the input i1 and the output o1, a one-dot chain line indicates the isolation of channel 2 including the input i2 and the output o2, and a solid line indicates the composite isolation of the channel 1 and the channel 2. FIGS. 3C and 3D are graphs illustrating the frequency characteristics of an amplitude balance and a phase balance between the receiving terminals Rx1 and Rx2 of the receiving filter 1 illustrated in FIG. 1, respectively.

Figure 4A:
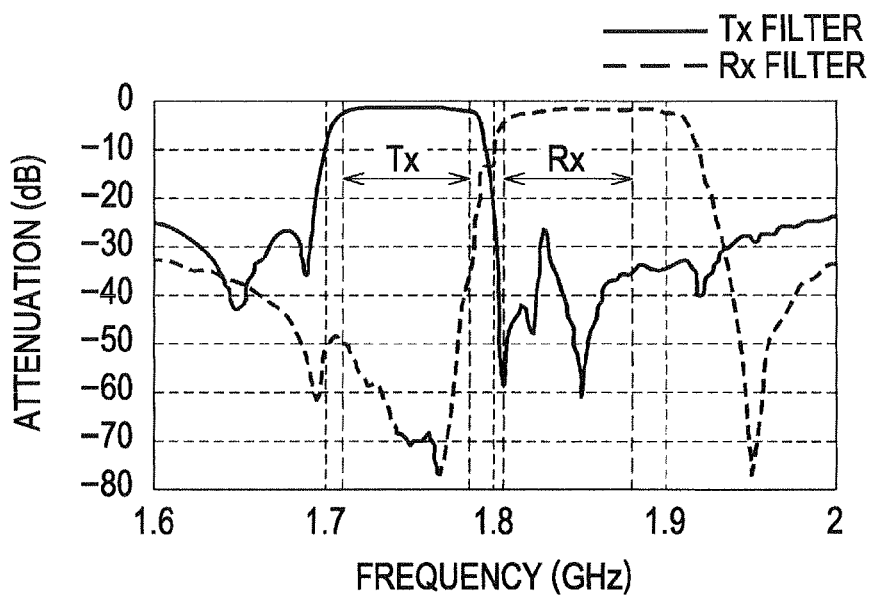
FIGS. 4A to 4D are graphs illustrating various characteristics of the duplexer in accordance with aspects of the present invention.
Figure 4B:
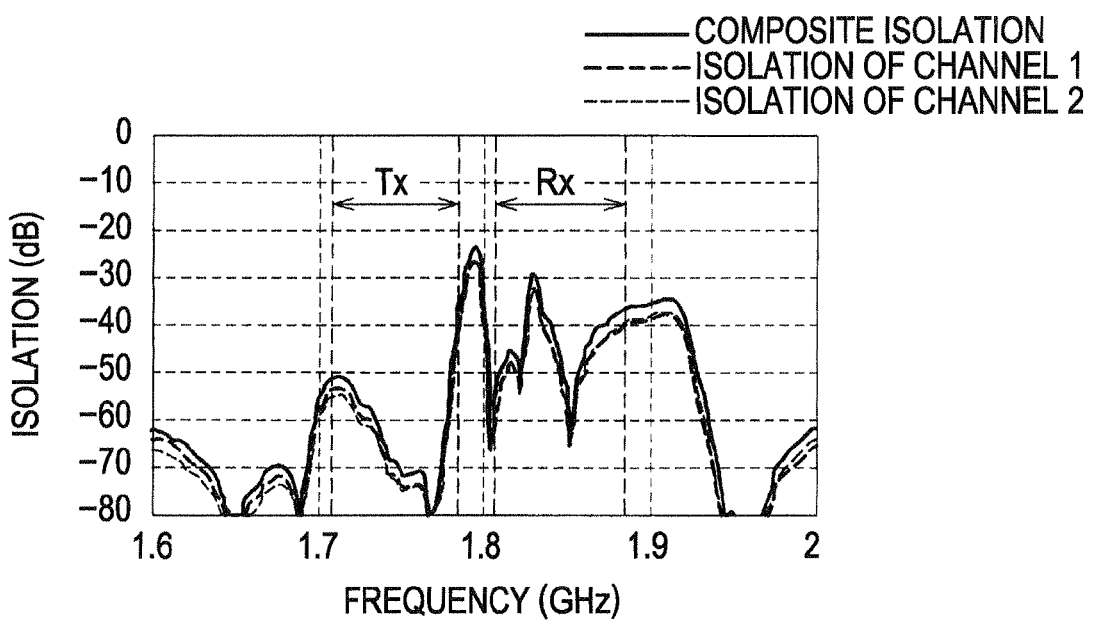
Figure 4C:
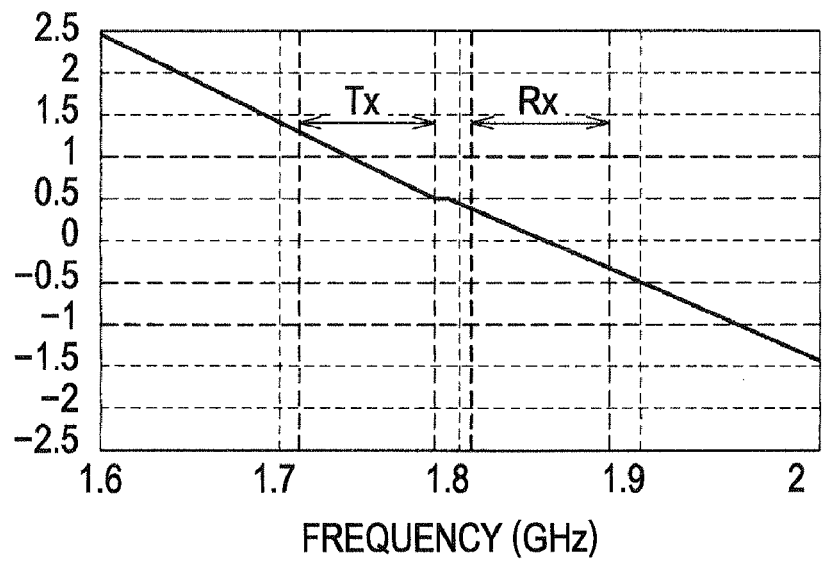
Figure 4D:
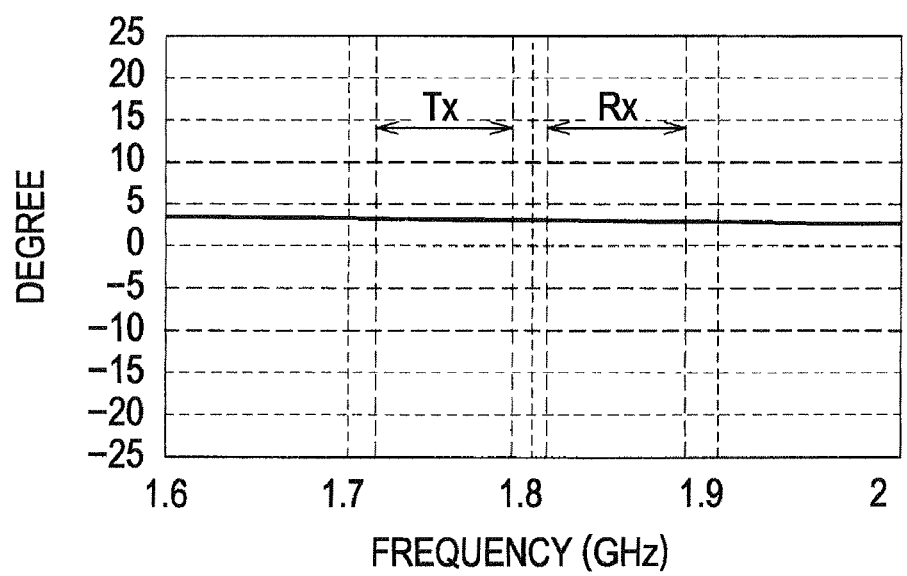

FIGS. 4A to 4D are graphs illustrating various characteristics of the duplexer illustrated in FIG. 2. FIG. 4A is a graph illustrating the transmission characteristics of the duplexer illustrated in FIG. 2, and FIG. 4B is a graph illustrating the isolation characteristics thereof. FIGS. 4C and 4D are graphs illustrating the frequency characteristics of an amplitude balance and a phase balance between the receiving terminals Rx1 and Rx2 of the receiving filter 91 illustrated in FIG. 2, respectively.

As may be seen from FIGS. 3A to 3D and FIGS. 4A to 4D, the receiving filter 1 illustrated in FIG. 1 has transmission characteristics, isolation characteristics, and balance characteristics equal to or greater than those of the receiving filter 91 illustrated in FIG. 2. For example, as may be seen from the comparison between FIG. 3B and FIG. 4B, the peak of the isolation characteristics at the boundary between a Tx band and an Rx band in the receiving filter 1 is less than that in the receiving filter 91. Therefore, in the receiving filter 1, an isolation value at a radio-frequency-side end of the Tx band may be less affected by a variation in the manufacture of an inductor and a frequency shift due to a temperature variation. As a result, the receiving filter 1 has improved the filter characteristics.

Figure 5:
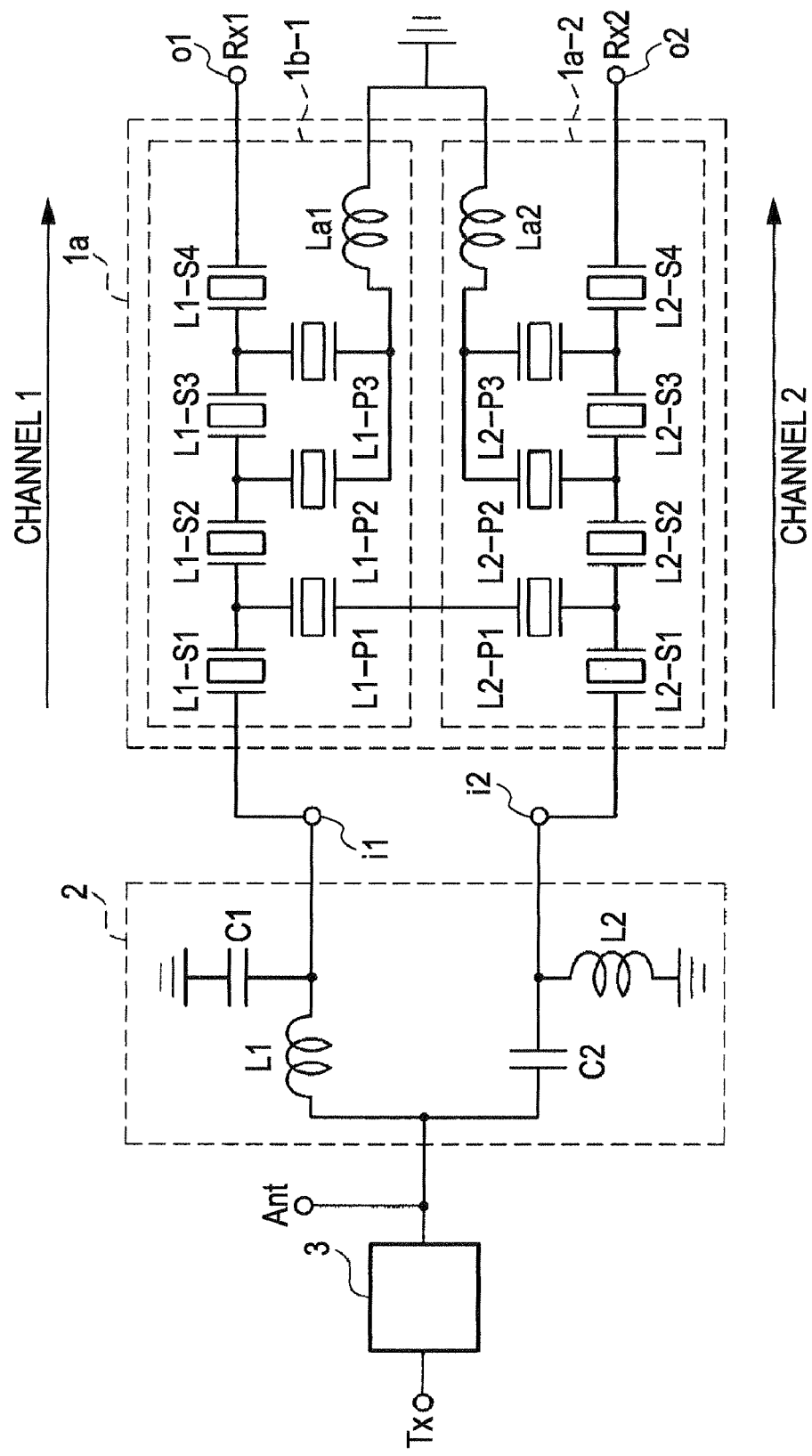
FIG. 5 is a circuit diagram illustrating a duplexer in accordance with aspects of the present invention.

FIG. 5 is a circuit diagram illustrating a duplexer including a balanced input/output filter according to another embodiment. In a receiving filter $1a$ illustrated in FIG. 5, a first-stage parallel resonator L1-P1 of a filter $1a$-1 is connected to a first-stage parallel resonator L2-P1 of a filter $1a$-2 corresponding thereto. As such, the two filters $1a$-1 and $1a$-2 include at least one set of the corresponding parallel resonators connected to each other. When the resonators are connected in this way, it may be possible to simplify a wiring pattern.

Figure 6A:
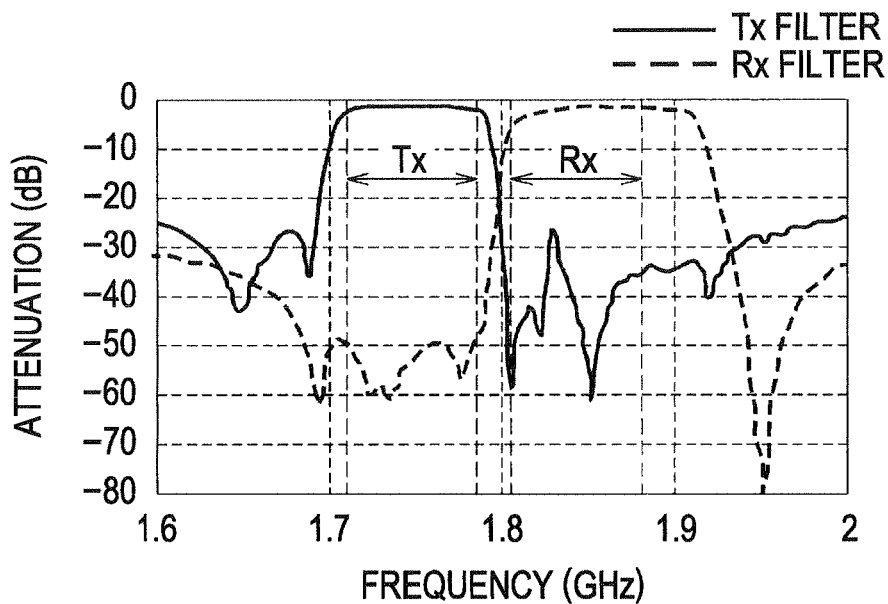
FIGS. 6A to 6D are graphs illustrating various characteristics of the duplexer in accordance with aspects of the present invention.
Figure 6B:
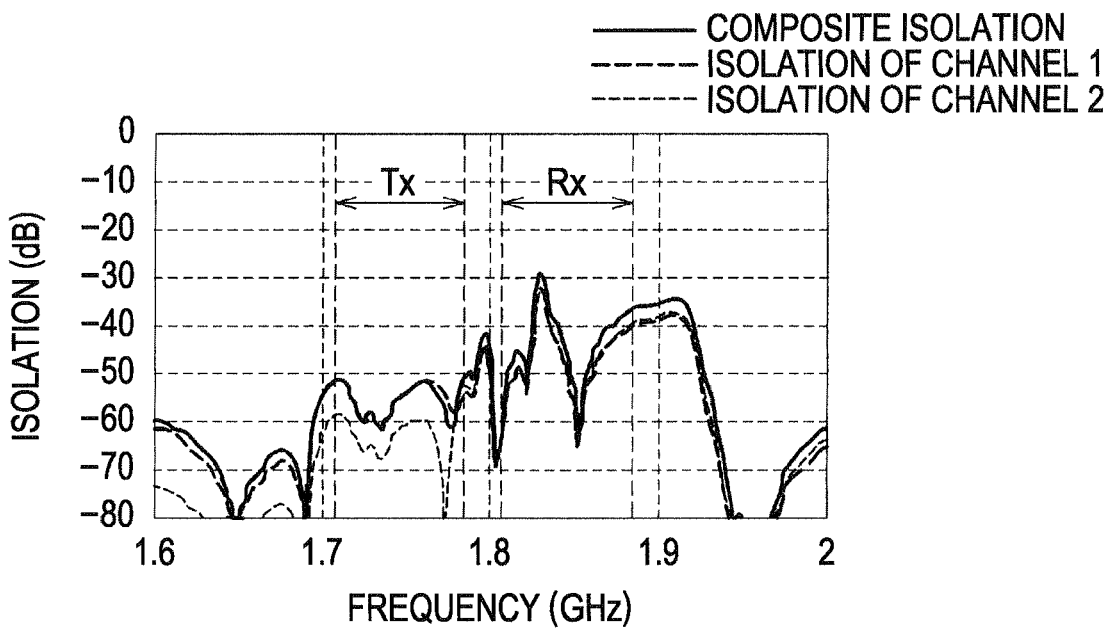
Figure 6C:
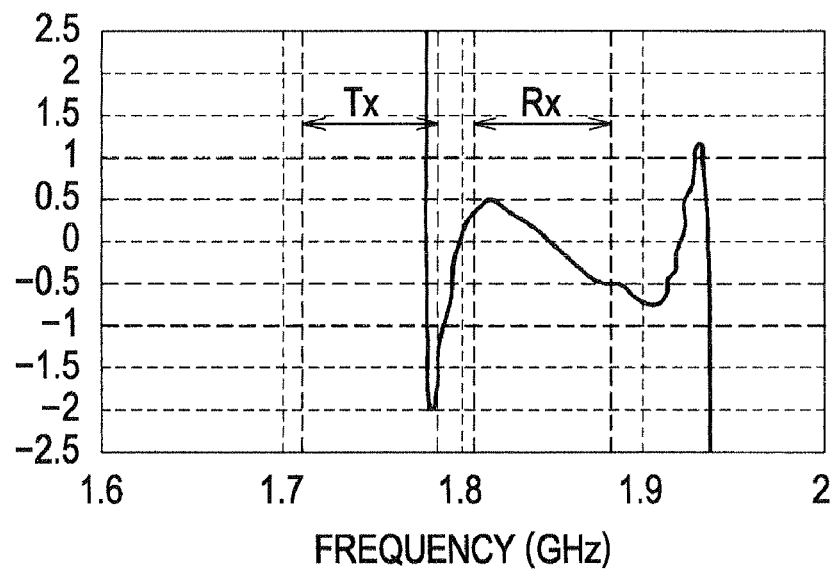
Figure 6D:
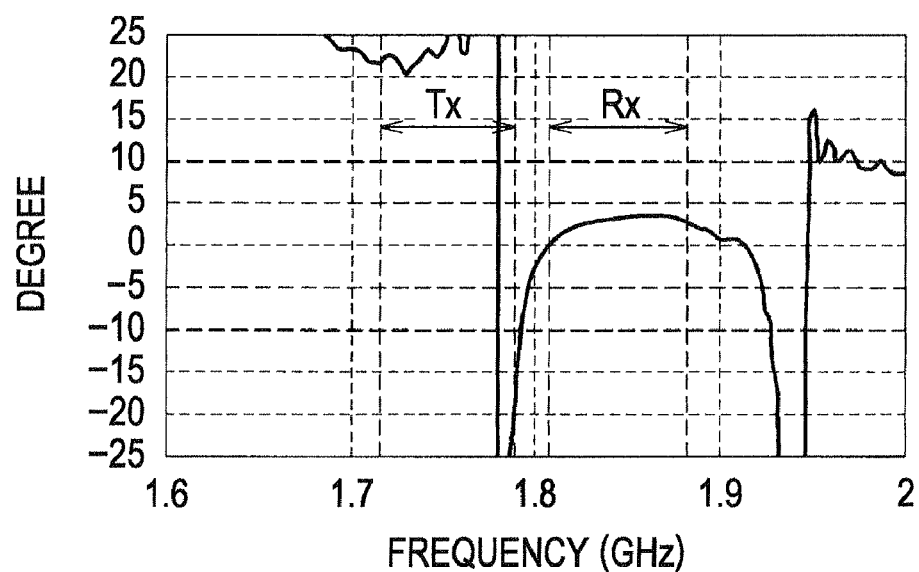

FIGS. 6A to 6D are graphs illustrating various characteristics of the duplexer illustrated in FIG. 5. FIG. 6A is a graph illustrating the transmission characteristics of the duplexer illustrated in FIG. 5, and FIG. 6B is a graph illustrating the isolation characteristics thereof. FIGS. 6C and 6D are graphs illustrating the frequency characteristics of an amplitude balance and a phase balance between the receiving terminals Rx1 and Rx2 of the receiving filter $1a$ illustrated in FIG. 5, respectively.

As may be seen from the graphs, the circuit illustrated in FIG. 5 has similar characteristics as the circuit illustrated in FIG. 1. For example, the composite isolation characteristics of the channels 1 and 2 illustrated in FIG. 6B have two valley portions in the transmission band (Tx band). Therefore, the composite isolation characteristics may be substantially flat. In contrast, in FIGS. 3B and 4B, the composite isolation characteristics have one valley portion in the transmission band and the composite isolation characteristics may have a V shape. Therefore, the isolation value of the duplexer illustrated in FIG. 5 that has substantially flat isolation characteristics is less affected by a variation in the manufacture of an inductor and a frequency shift due to a temperature variation than the duplexer illustrated in FIGS. 1 and 2.

In this embodiment, one set of parallel resonators connected to each other is given as an example. However, two or more sets of corresponding parallel resonators may be connected to each other. In addition, in another embodiment, instead of connecting corresponding parallel resonators in two filters $1a$-1 and $1a$-2, the two filters $1a$-1 and $1a$-2 share one parallel resonator. For example, the parallel resonators L1-P1 and L2-P1 connected to each other in FIG. 5 may be replaced with one resonator. The circuit having this aspect may also obtain the same effects as described above.

Figure 7:
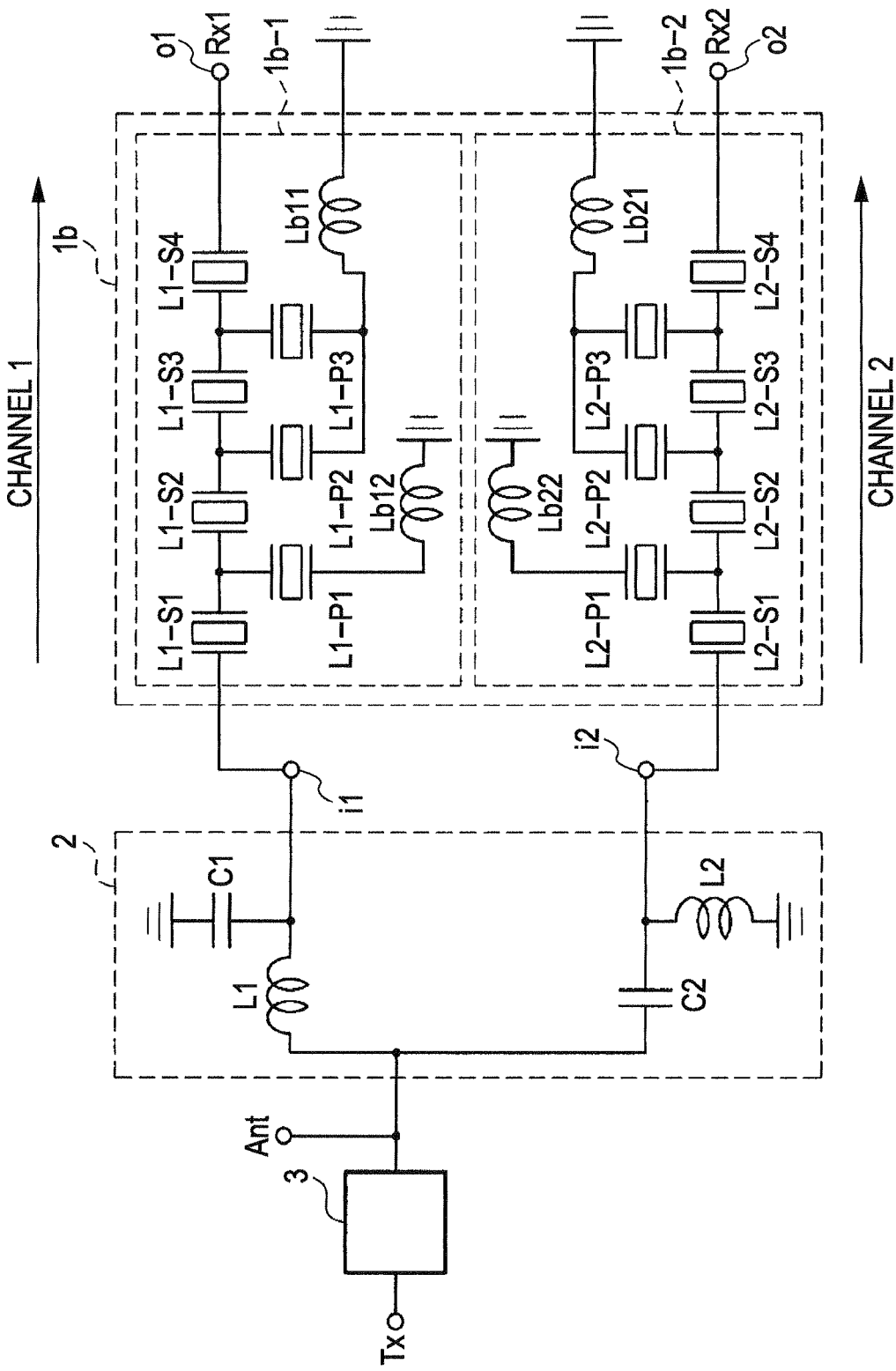
FIG. 7 is a circuit diagram illustrating a duplexer in accordance with aspects of the present invention.

FIG. 7 is a circuit diagram illustrating a duplexer including a balanced input/output filter according to another embodiment. In a filter $1b$-1 of a receiving filter $1b$ illustrated in FIG. 7, parallel resonators L1-P1 to L1-P3 are classified into two sets of parallel resonators, that is, a first set of a first-stage parallel resonator L1-P1 and a second set of second-stage and third-stage resonators L1-P2 and L1-P3, and the two sets of parallel resonators are connected to inductances Lb11 and Lb12. That is, the parallel resonator L1-P1 is connected to the inductance Lb12, and the parallel resonators L1-P2 and L1-P3 are connected to the inductance Lb11. The sets of parallel resonators are not limited to the example illustrated in FIG. 7.

Similarly, in a filter $1b$-2, parallel resonators L2-P1 to L2-P3 are classified into two sets (L1-P1, and L1-P2 and L1-P3), and one end of each of the two sets of parallel resonators is connected to the corresponding inductances Lb21 and Lb22. According to this circuit aspect, it is possible to individually adjust the values of the inductances connected to each set of parallel resonators. As a result, for example, it is possible to finely adjust filter characteristics, such as but not limited to transmission band attenuation characteristics. In addition, the duplexer illustrated in FIG. 7 has substantially the same characteristics as the duplexer illustrated in FIG. 1.

Figure 8:
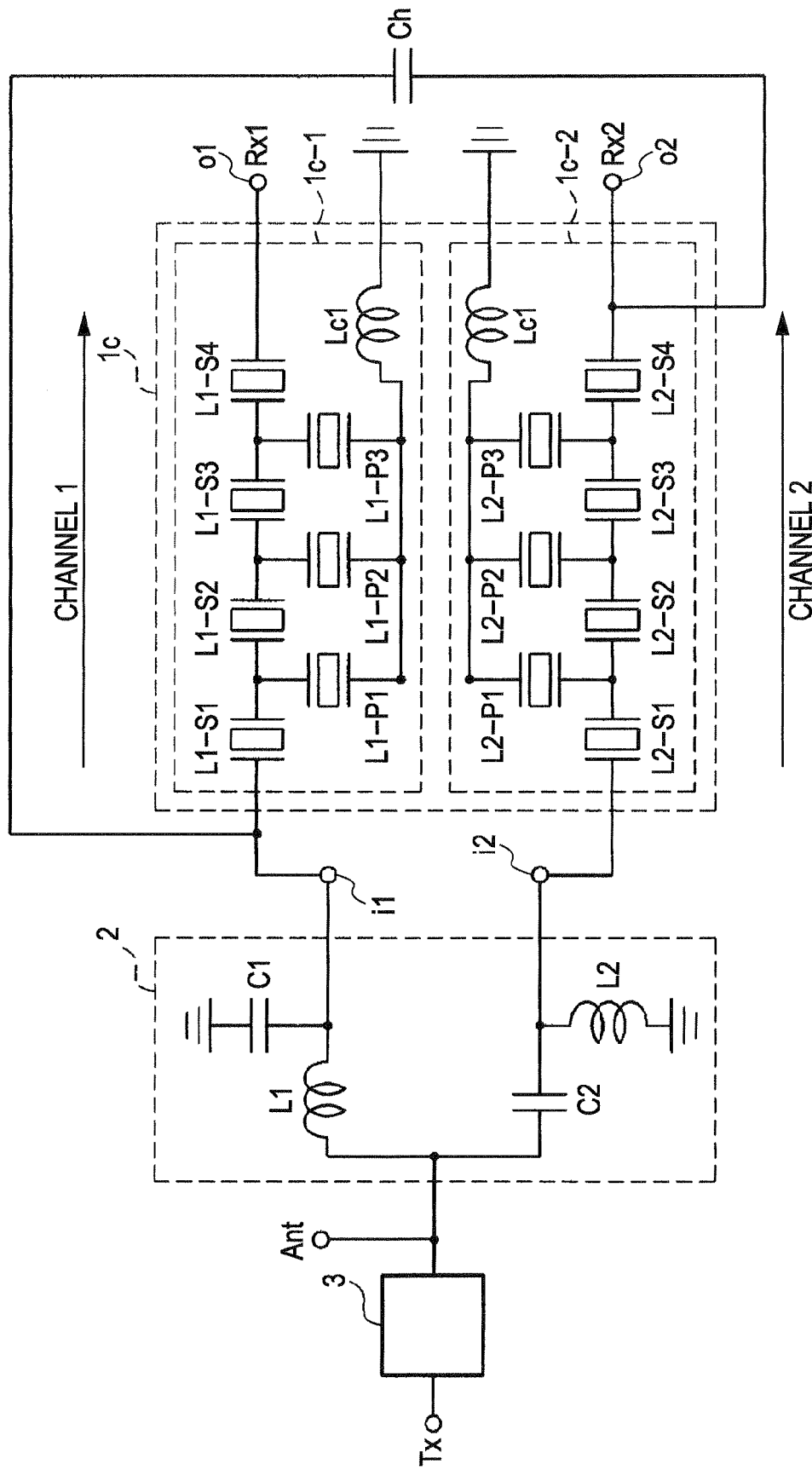
FIG. 8 is a circuit diagram illustrating a duplexer in accordance with aspects of the present invention.

FIG. 8 is a circuit diagram illustrating a duplexer including a balanced input/output filter according to another embodiment. In a receiving filter $1c$ illustrated in FIG. 8, a capacitance Ch is provided between the input i1 and the output o2. The receiving filter $1c$ is similar to the receiving filter 1 except that the capacitance Ch is provided. As such, since the diagonal capacitance Ch is provided between the input terminal (input i1) of one filter $1c$-1 and the output terminal (output o2) of the other filter $1c$-2, the characteristics of the illustrated balanced-unbalanced filter are effective to improve the transmission band attenuation characteristics of the receiving filter 2.

Figure 9A:
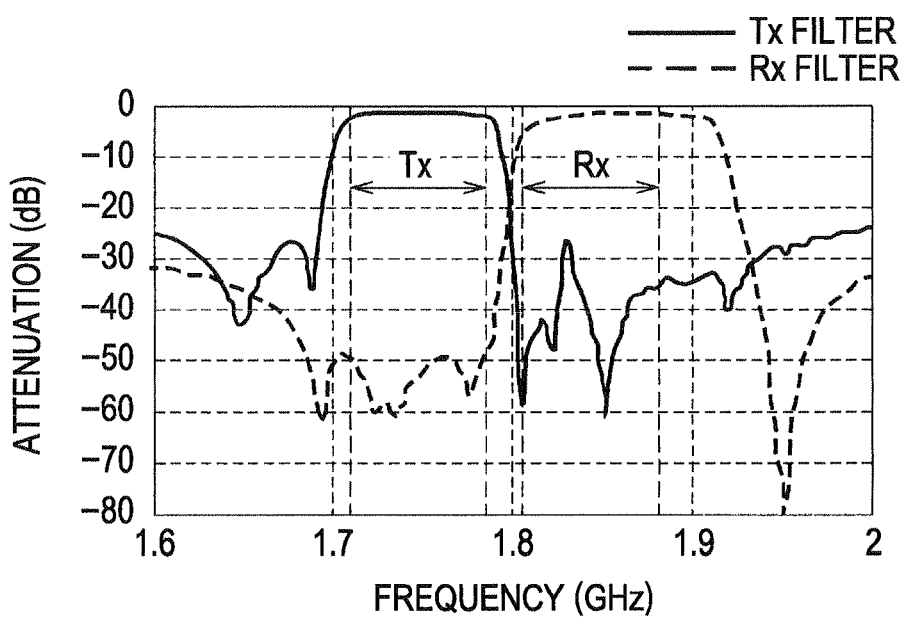
FIGS. 9A to 9D are graphs illustrating various characteristics of the duplexer in accordance with aspects of the present invention.
Figure 9B:
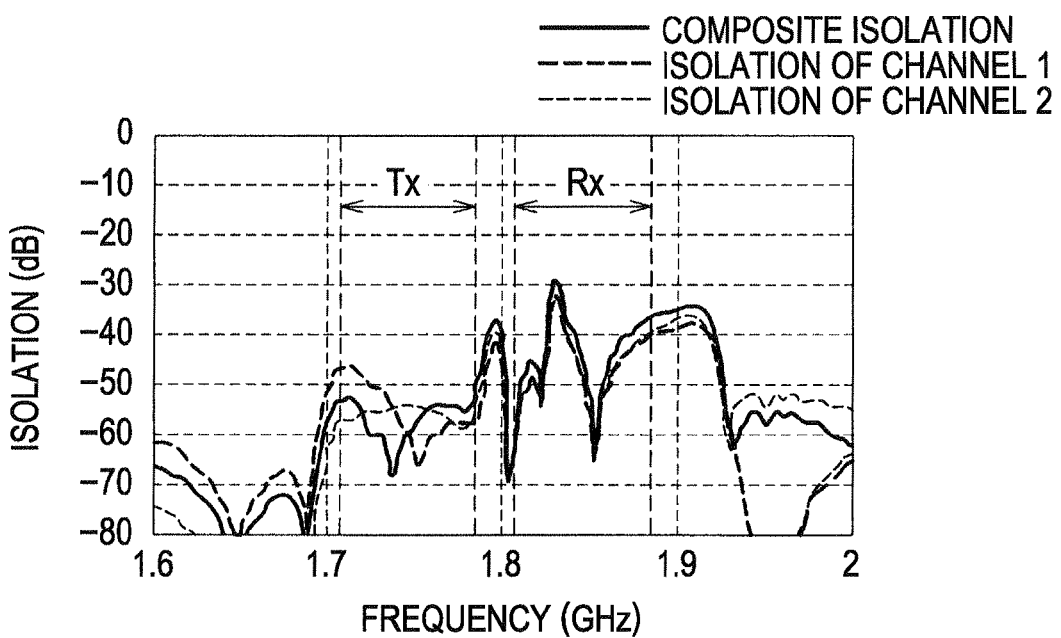
Figure 9C:
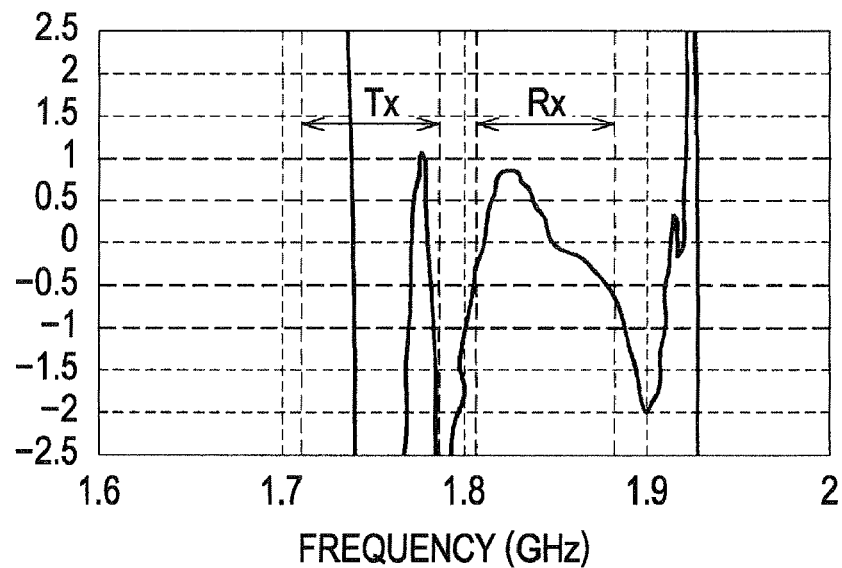
Figure 9D:
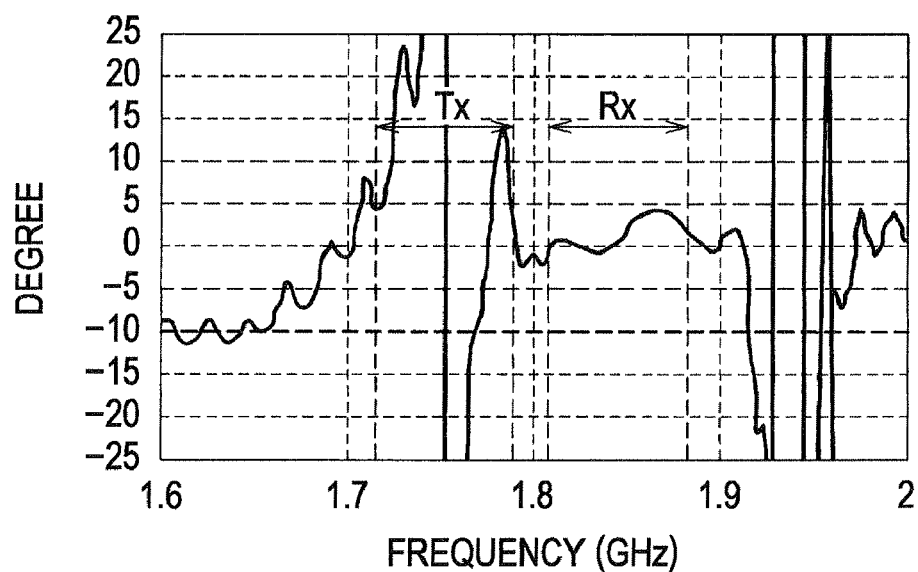

FIGS. 9A to 9D are graphs illustrating various characteristics of the duplexer illustrated in FIG. 8. FIG. 9A is a graph illustrating the transmission characteristics of the duplexer illustrated in FIG. 8, and FIG. 9B is a graph illustrating the isolation characteristics thereof. FIGS. 9C and 9D are graphs illustrating the frequency characteristics of an amplitude balance and a phase balance between the receiving terminals Rx1 and Rx2 of the receiving filter $1c$ illustrated in FIG. 8, respectively. As may be seen from the graphs, the isolation characteristics (FIG. 9D) and the transmission band attenuation characteristics (FIG. 9C) of the circuit illustrated in FIG. 8 are improved, as compared to the characteristics (FIGS. 3C and 3D) of the circuit illustrated in FIG. 1. As such, when the capacitance Ch (diagonal capacitance) is provided between diagonal terminals among four terminals of the balanced input/output filter, the isolation waveforms of the channel 1 and the channel 2 differ from each other. As a result, flat composite isolation characteristics may be obtained. Therefore, the isolation value of the duplexer illustrated in FIG. 8 at the low and high frequency ends of the Tx band is improved, as compared to the duplexer having V-shaped isolation characteristics as illustrated in FIG. 3B.

On the contrary to this embodiment, the diagonal capacitance Ch may be provided between the input terminal (input i2) of the filter 1c-2 and the output terminal (output o1) of the filter 1c-1. In addition, the diagonal capacitance Ch may be provided in a receiving filter according to the second or third embodiment. As such, it may be possible to obtain the same effects as described above.

Figure 10A:
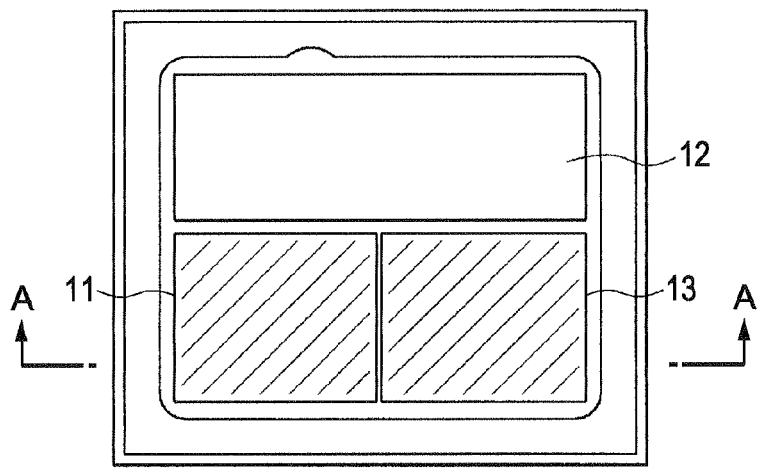
FIGS. 10A to 10E are diagrams illustrating an example of mounting the duplexer in accordance with aspects of the present invention.
Figure 10B:
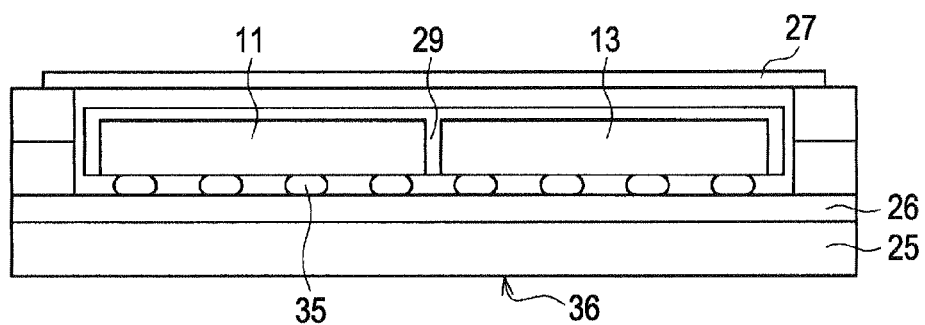

An embodiment of a package relates to an example of mounting the duplexer according to the above-described embodiment. FIGS. 10A to 10E are diagrams illustrating an example of the mounting of the duplexer illustrated in FIG. 1. FIG. 10A is a top view illustrating the duplexer mounted in a package, and FIG. 10B is a cross-sectional view illustrating the package taken along the line A-A. In the example illustrated in FIGS. 10A to 10E, a balun chip 12, a transmitting filter chip 13, and a receiving filter chip 11 are mounted in a ceramic package 36 having a cavity 29 in a flip chip manner. The balun chip 12 is an IPD chip having the balun 2 illustrated in FIG. 1 formed therein. The transmitting filter chip 13 has the transmitting filter 3 formed therein, and the receiving filter chip 11 has the receiving filter 1 formed therein. These chips and the ceramic package 36 are electrically connected to each other by, for example, Au bumps 35. A metal lead 27 is provided as a cap on the top of the ceramic package 36 having these chips mounted therein. In this way, the cavity 29 is airtightly sealed.

The ceramic package 36 is, for example, a laminated package including a die attach chip layer 26 on which chips are mounted and an intermediate layer 25 provided below the die attach chip layer 26. In this case, foot pads are provided on the rear surface of the intermediate layer 25 to form a foot pad layer.

Figure 10C:
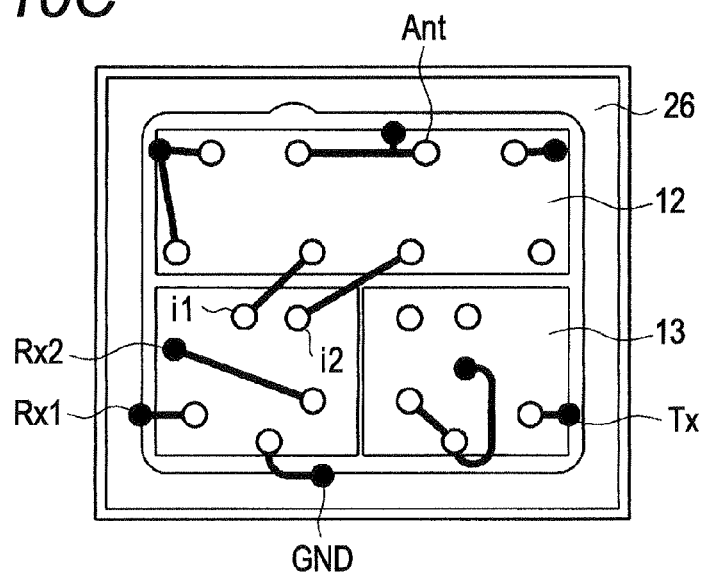
Figure 10D:
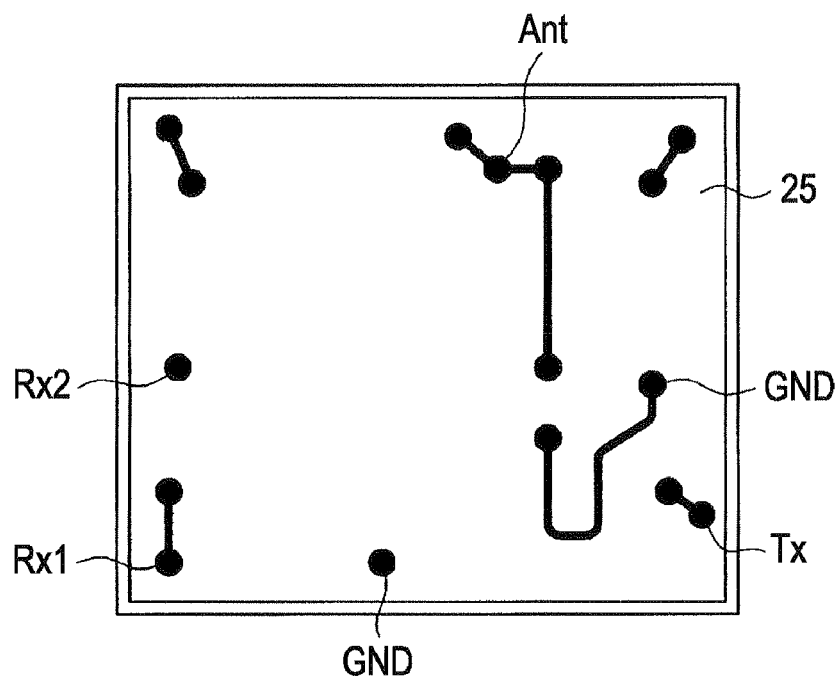
Figure 10E:
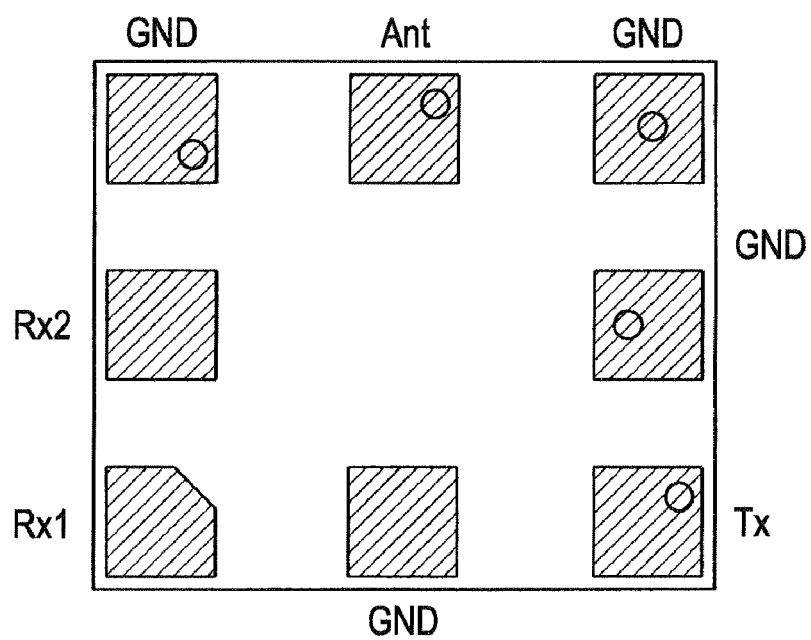

FIG. 10C is a diagram illustrating an example of the wiring layout of the die attach chip layer 26 of the ceramic package 36. FIG. 10D is a diagram illustrating an example of the wiring layout of the surface of the intermediate layer 25 provided below the die attach chip layer 26. FIG. 10E is a diagram illustrating the arrangement of the foot pads in the foot pad layer provided below the die attach chip layer 26.

In FIGS. 10C and 10D, a white circle indicates a bump connecting the chip and the ceramic package 36. In addition, a black circle indicates a via connected to another layer. Symbols indicating terminals in FIGS. 10C and 10D (Rx1, Rx2, Tx, Ant, i1, and i2) correspond to those illustrated in FIG. 1, and 'GND' means the ground. In addition, FIGS. 10C to 10E illustrate the layout of lines and terminals related to description, but the other layouts are omitted.

In the die attach chip layer illustrated in FIG. 10B, the antenna terminal Ant of the balun chip 12 is connected to an Ant foot pad illustrated in FIG. 10E through the intermediate layer 25 by a line pattern and the via. In addition, in the die attach chip layer 26 illustrated in FIG. 10B, the output terminal of the balun chip 12 and the inputs i1 and i2 of the receiving filter chip 11 are connected to each other by a line pattern. The receiving terminals Rx1 and Rx2 of the receiving filter chip 11 are connected to an Rx1 foot pad and an Rx2 foot pad of the foot pad layer illustrated in FIG. 10E through the intermediate layer 25 by the vias, respectively.

Figure 11A:
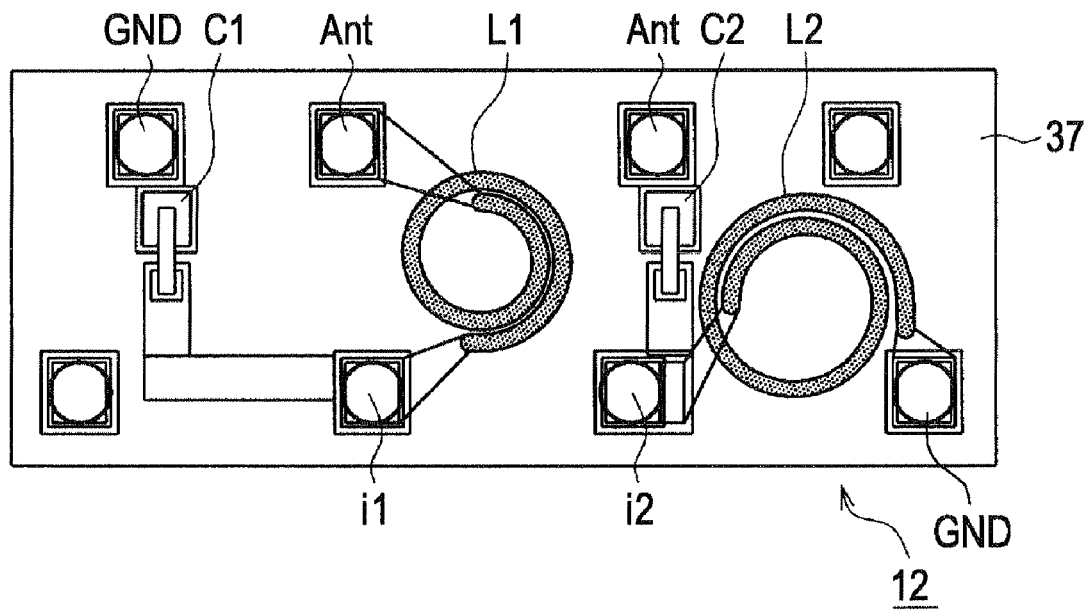
FIG. 11A is a plan view illustrating a balun chip 12 in accordance with aspects of the present invention.

FIG. 11A is a plan view illustrating the balun chip 12. In the example illustrated in FIG. 11, a capacitor C2 is formed between a bump for the antenna terminal Ant and a bump for the input i2, and an inductor L2 is formed between a bump for the input i2 and a GND bump on a quartz substrate 37. In addition, an inductor L1 is formed between the bump for the antenna terminal Ant and the bump for the input i1 and a capacitor C1 is formed between the bump for the input i1 and the GND bump. The inductors L1 and L2 are spiral inductors made of a metal film, such as a copper film. The capacitors C1 and C2 are made of, for example, metal-insulator-metal (MIM) capacitors.

Figure 11B:
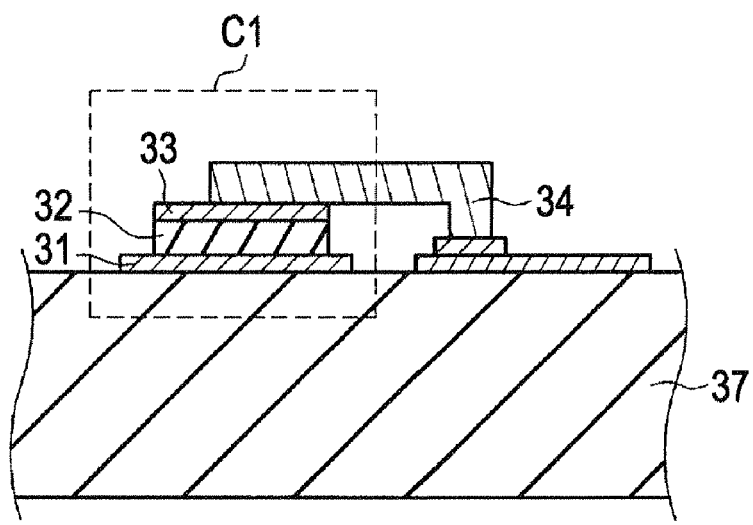
FIG. 11B is a cross-sectional view illustrating a MIM capacitor in accordance with aspects of the present invention.

FIG. 11B is a cross-sectional view illustrating the MIM capacitor. The MIM capacitor is a laminate including a lower electrode 31, a dielectric 32, and an upper electrode 33 provided on the substrate 37. The upper electrode 33 is connected to a conductor on the substrate 37 by a copper wiring line 34. As such, it is possible to obtain a small and inexpensive balanced-unbalanced filter by forming the balun 2 in a circuit using the concentrated constants of an inductor and a capacitor.

Figure 12:
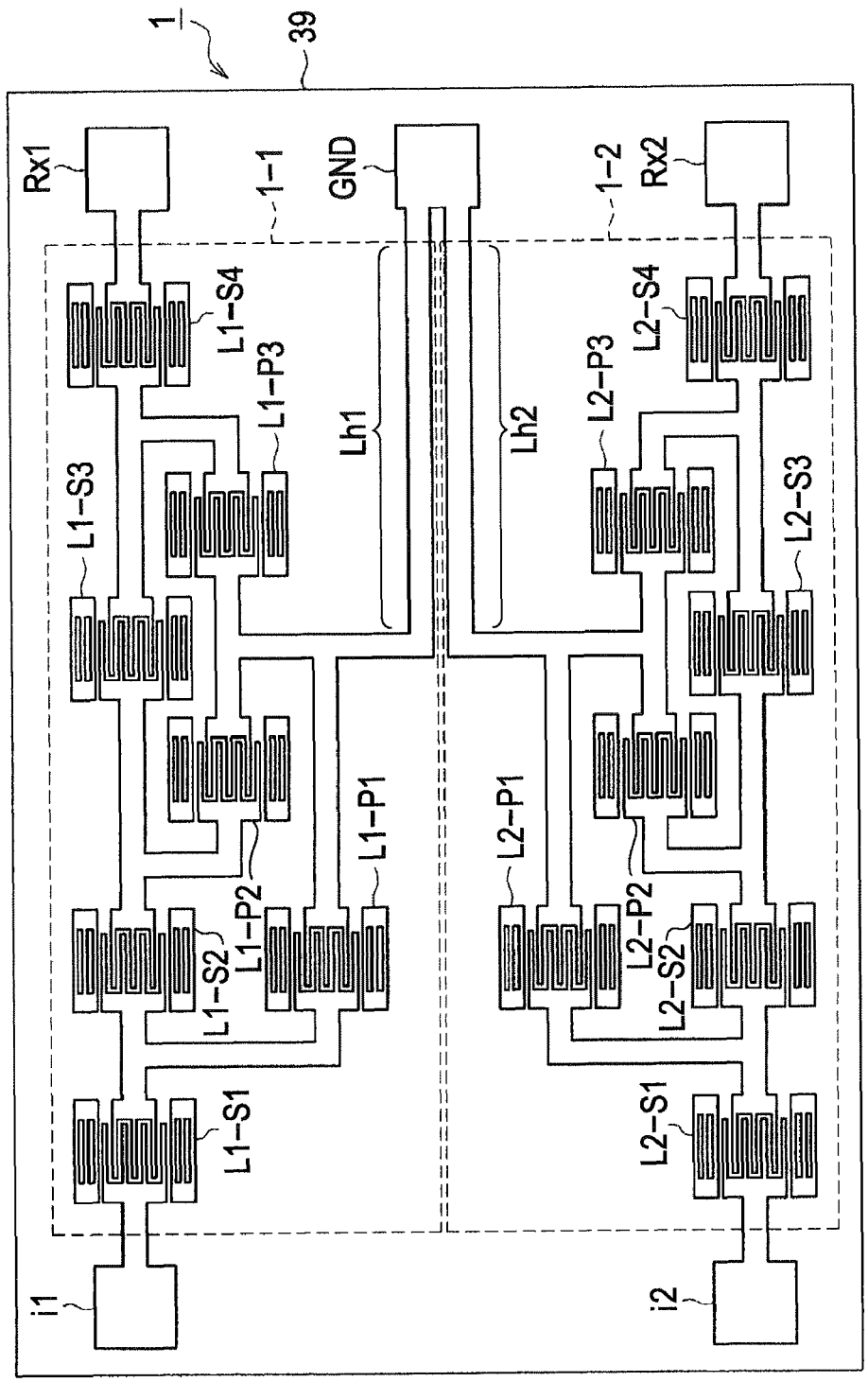
FIG. 12 is a plan view illustrating a receiving filter chip in accordance with aspects of the present invention.

FIG. 12 is a plan view illustrating the receiving filter chip 11 having the receiving filter 1 illustrated in FIG. 1 formed therein. In FIG. 12, reference numerals indicating components correspond to those indicating the components illustrated in FIG. 1. In the example illustrated in FIG. 12, series resonators L1-S1 to L1-S4 and L2-S1 to L2-S4 and parallel resonators L1-P1 to L1-P3 and L2-P1 to L2-P3 of a ladder filter provided on a piezo-electric substrate 39 are surface acoustic wave devices. The SAW devices are connected to the inputs i1 and i2, the receiving terminals Rx1 and Rx2, and the ground terminal GND by a line pattern.

Inductances Lh1 and Lh2 are formed by two transmission lines extending from the ground terminal GND. As such, at least a portion of each of the inductances Lh1 and Lh2 inherent in the filters 1-1 and 1-2 is formed by a conductor pattern on the surface of the chip. In this way, it is possible to further reduce the size of a balanced-unbalanced filter device.

Figure 13:
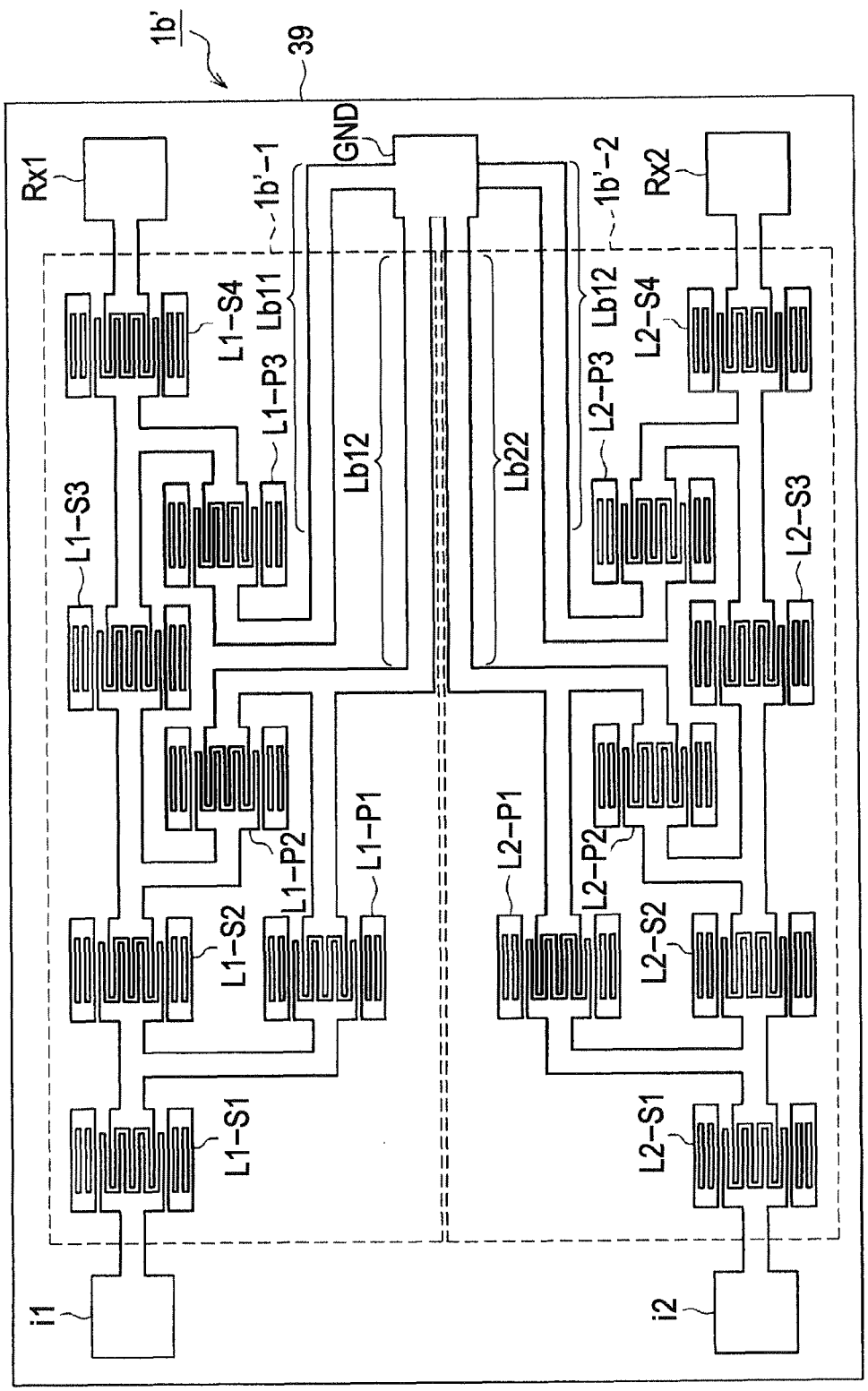
FIG. 13 is a plan view illustrating a receiving filter chip in accordance with aspects of the present invention.

FIG. 13 is a plan view illustrating the receiving filter chip 11 having a filter 1b', which is a partial modification of the receiving filter 1b illustrated in FIG. 7, formed therein. In FIG. 13, components corresponding to those illustrated in FIG. 7 are denoted by the same reference numerals. In the example illustrated in FIG. 13, series resonators L1-S1 to L1-S4 and L2-S1 to L2-S4 and parallel resonators L1-P1 to L1-P3 and L2-P1 to L2-P3 of ladder filters 1b'-1 and 1b'-2 are made of surface acoustic wave devices. Four transmission lines extending from the ground terminal GND form inductances Lb11, Lb12, Lb21, and Lb22.

In the filter 1b'-1, the parallel resonators L1-P1 and L1-P2 are connected to the inductance Lb12, and the parallel resonator L1-P3 is connected to the inductance Lb11. In the filter 1b'-2, the parallel resonators L2-P1 and L2-P2 are connected to the inductance Lb22, and the parallel resonator L2-P3 is connected to the inductance Lb21.

Figure 14:
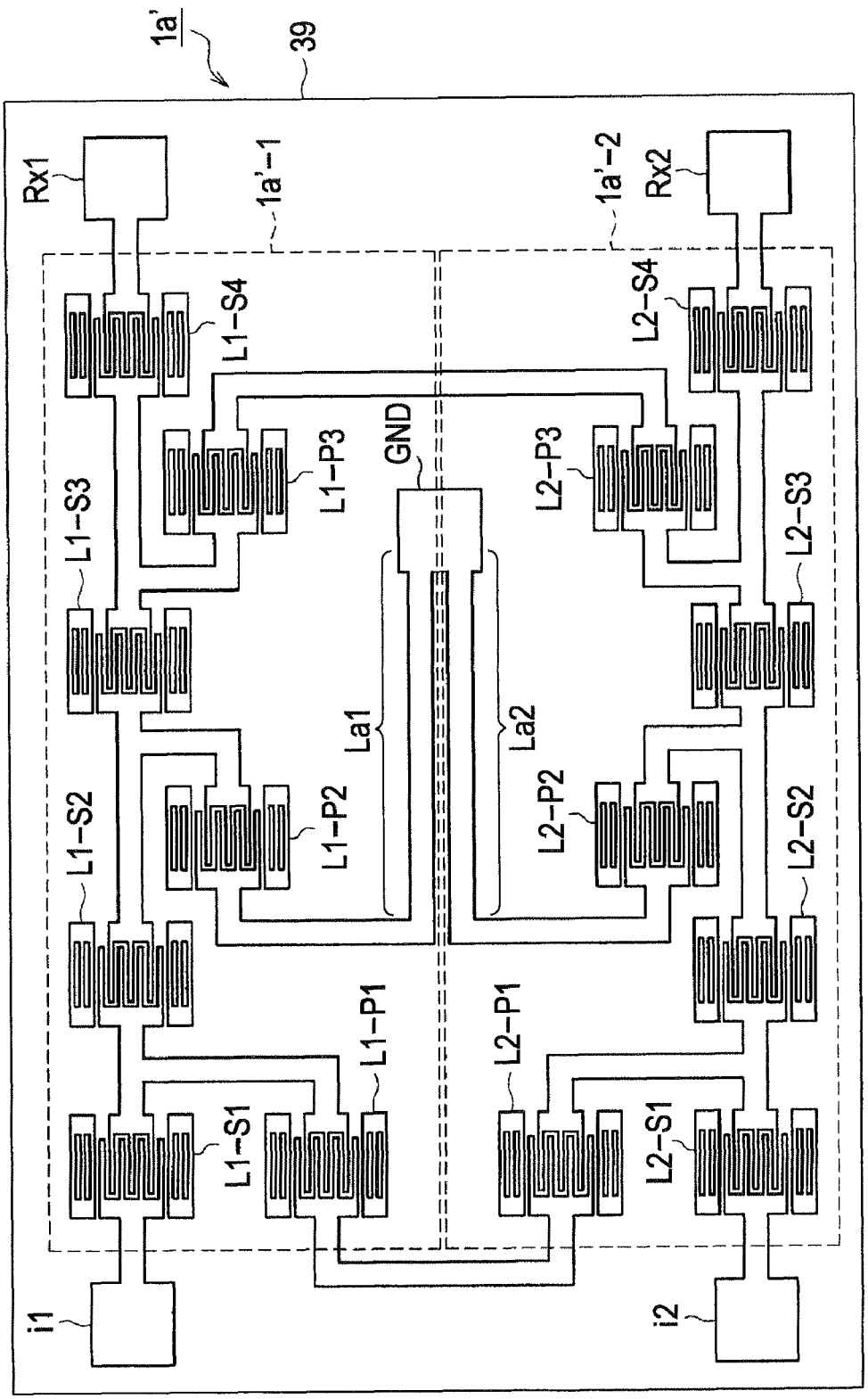
FIG. 14 is a plan view illustrating a receiving filter chip in accordance with aspects of the present invention.

FIG. 14 is a plan view illustrating the receiving filter chip 11 having a filter 1a', which is a partial modification of the receiving filter 1a illustrated in FIG. 5, formed therein. In FIG. 14, components corresponding to those illustrated in FIG. 5 are denoted by the same reference numerals. In the filter 1a' illustrated in FIG. 14, the parallel resonators L1-P1 and L2-P1 are connected to each other, and the parallel resonators L1-P3 and L2-P3 are connected to each other. The inductances La1 and La2 are formed by two transmission lines extending from the ground terminal GND. The inductance La1 is connected to the parallel resonator L1-P2, and the inductance La2 is connected to the parallel resonator L2-P2.

Figure 15A:
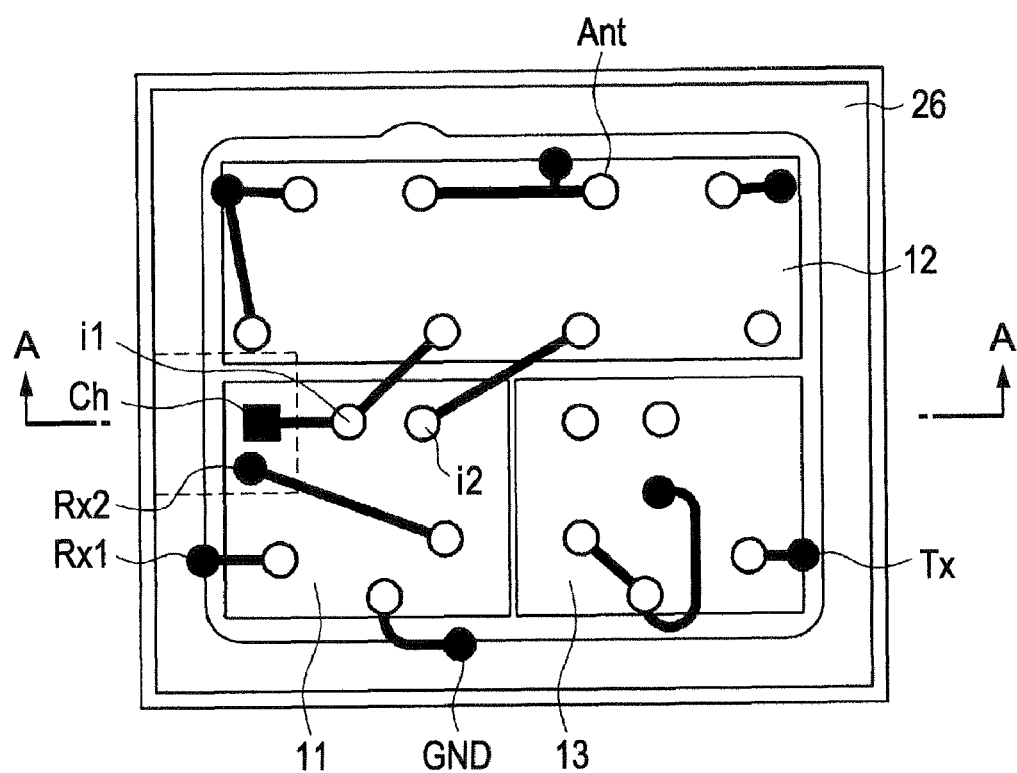
FIGS. 15A and 15B are diagrams illustrating a capacitance Ch formed in a die attach chip layer 26 in accordance with aspects of the present invention.
Figure 15B:
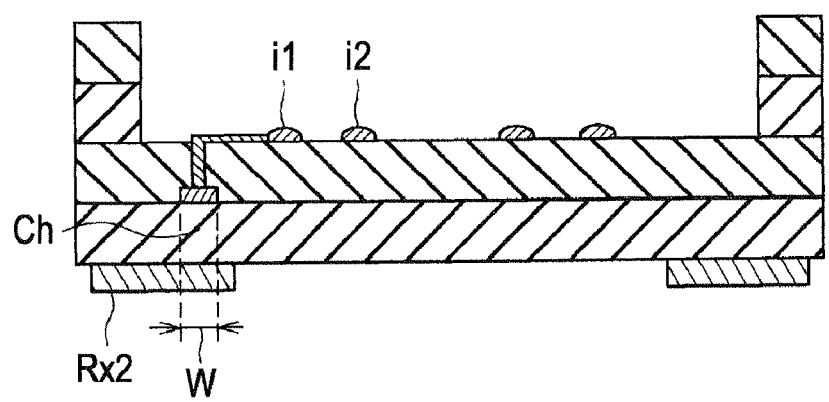

FIGS. 15A and 15B are diagrams illustrating a capacitance Ch formed in a die attach chip layer 26 in accordance with aspects of the present invention. As such, an example in which the diagonal capacitance Ch illustrated in FIG. 8 is formed in the ceramic package 36 will be described. FIG. 15A is a plan view illustrating the case in which the capacitance Ch is formed by a line pattern in the die attach chip layer 26. In FIG. 15A, the position of an Rx2 foot pad is represented by a dotted line. FIG. 15B is a cross-sectional view taken along the line XA-XA of FIG. 15A. The line pattern extends from a bump for the input i1 to the upper side of the Rx2 foot pad. As such, since the line pattern (wiring line) connected to the bump for the input i1 extends to a portion immediately above the foot pad for the receiving terminal Rx2, the line pattern and the foot pad for the receiving terminal Rx2 form a parallel plate capacitor having ceramic as a dielectric layer. Therefore, an overlapping portion W between the line pattern and the foot pad is adjusted to set the capacitance value. In this way, the diagonal capacitance Ch has a simple structure. Therefore, it is possible to improve filter characteristics without any interference due to, for example, an increase in the size of a package or a complicated wiring structure.

Although the examples of the mounting of the duplexer have been described above, the mounting of the duplexer is not limited to the above-mentioned examples. For example, the inductance Lh1 may be, for example, a metal wire or a printed-circuit-board spiral inductor. In addition, in the mounting examples, the resonator of the receiving filter is a SAW (surface acoustic wave) device, but the resonator is not limited thereto. The resonator may be made of, for example, an FBAR (film bulk acoustic resonator), an acoustic boundary wave device, etc.

Figure 16:
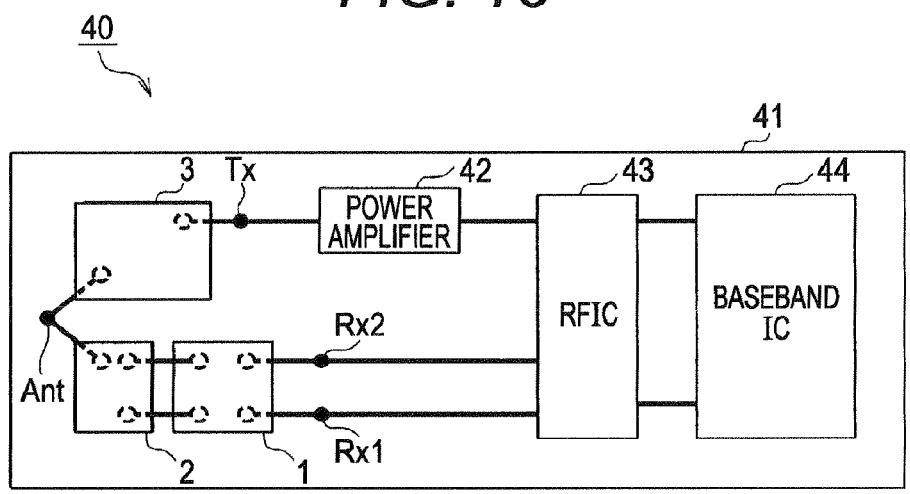
FIG. 16 is a diagram illustrating a communication apparatus 40 in accordance with aspects of the present invention.
Figure 17:
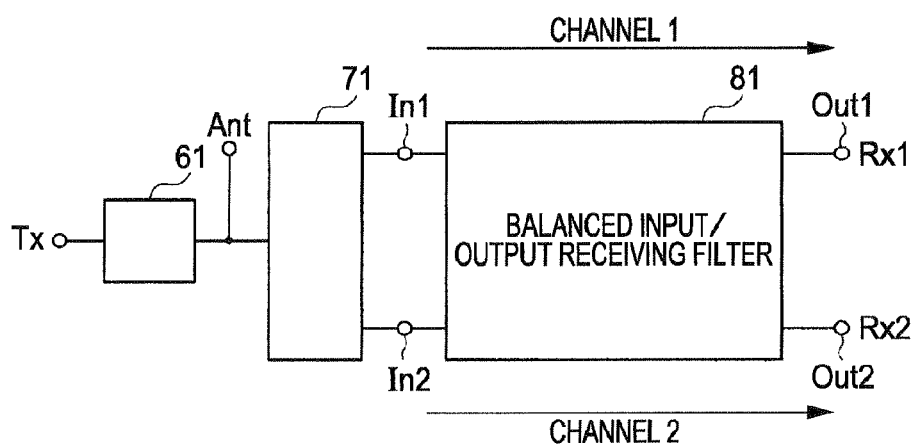
FIG. 17 is a circuit diagram illustrating a duplexer.
Figure 18:
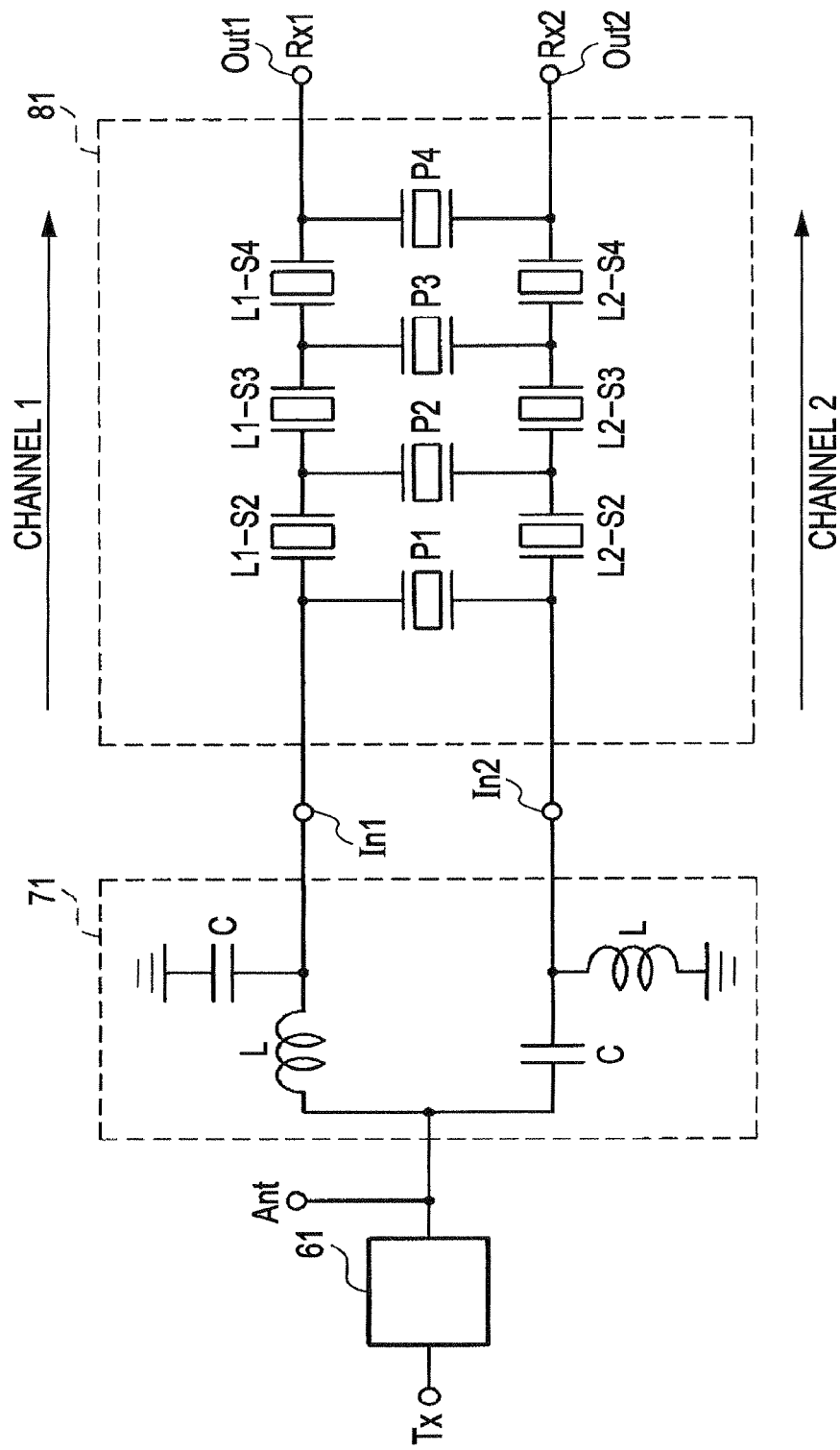
FIG. 18 is a diagram illustrating a balun 71 and a balanced input/output receiving filter 81.
Figure 19:
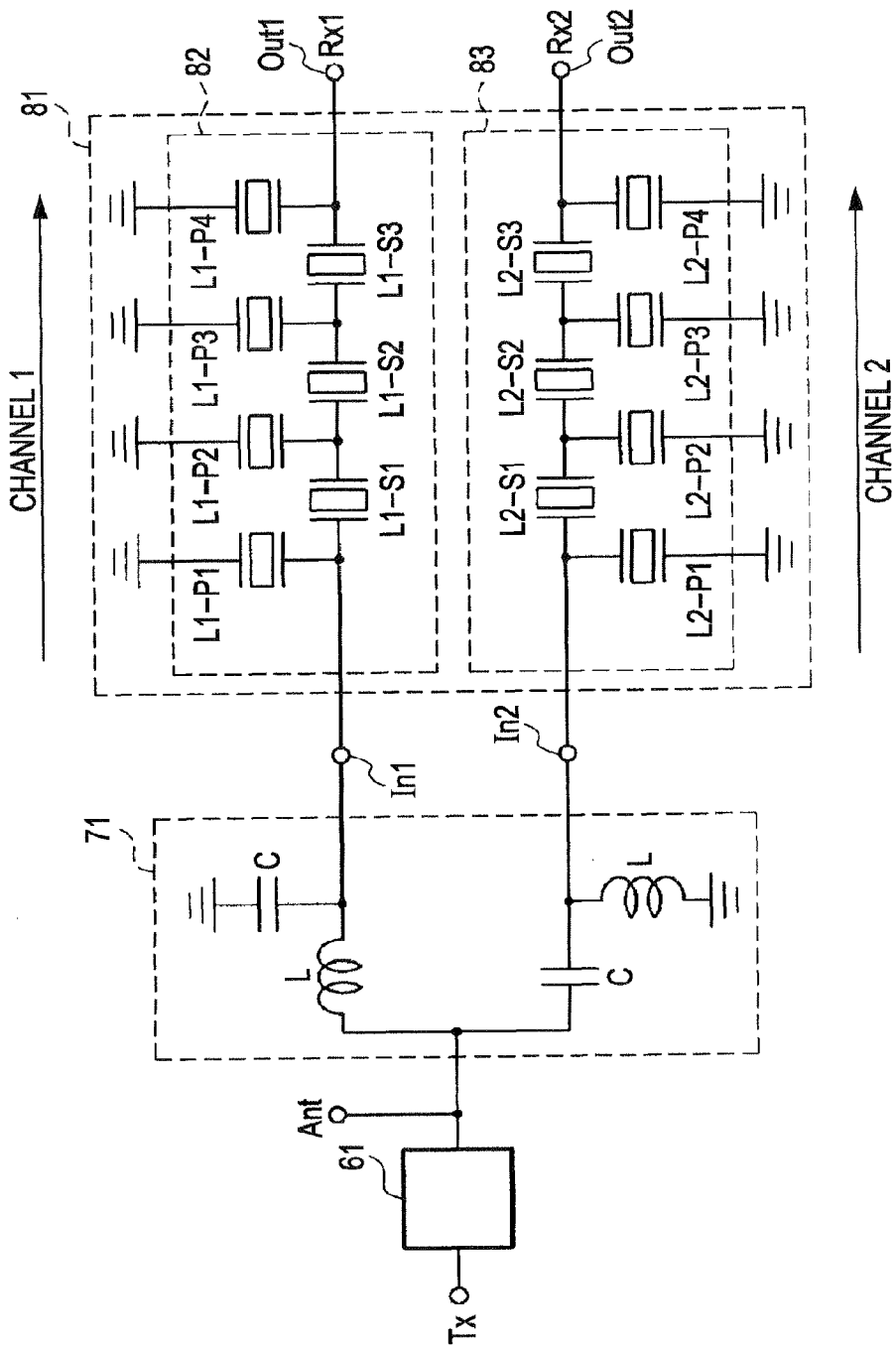
FIG. 19 is a diagram illustrating the balanced input/output receiving filter 81.
Figure 20A:
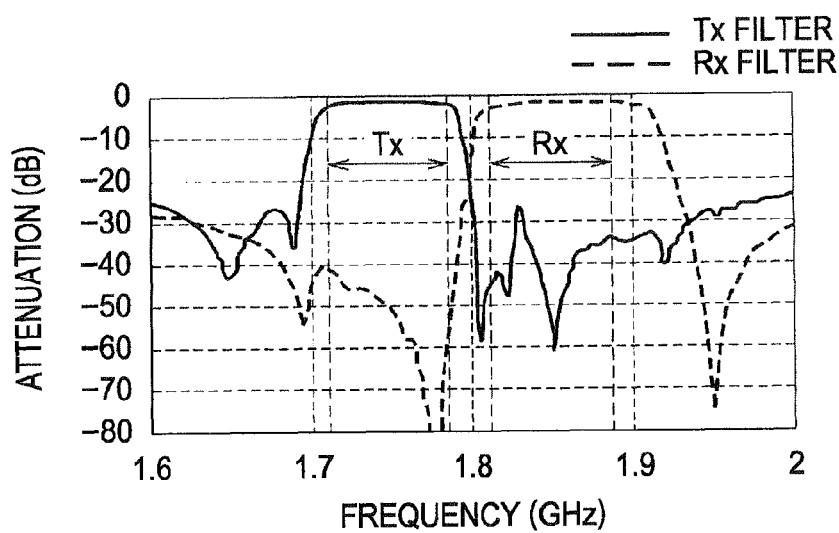
FIGS. 20A and 20B are graphs illustrating various characteristics of a full ladder circuit.
Figure 20B:
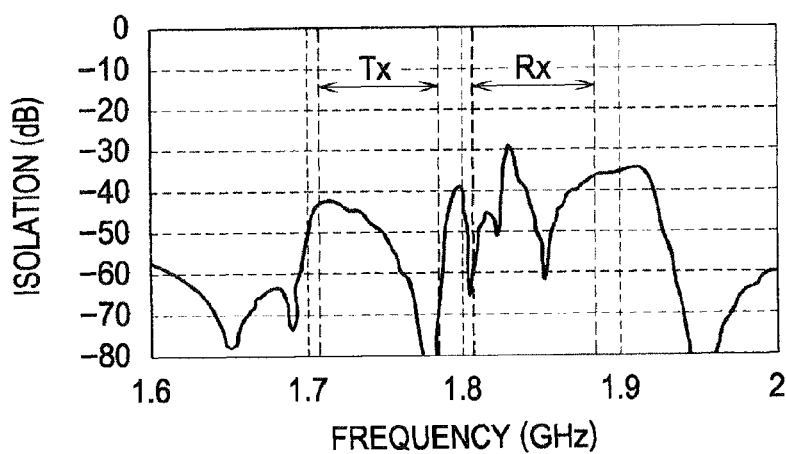
Figure 21A:
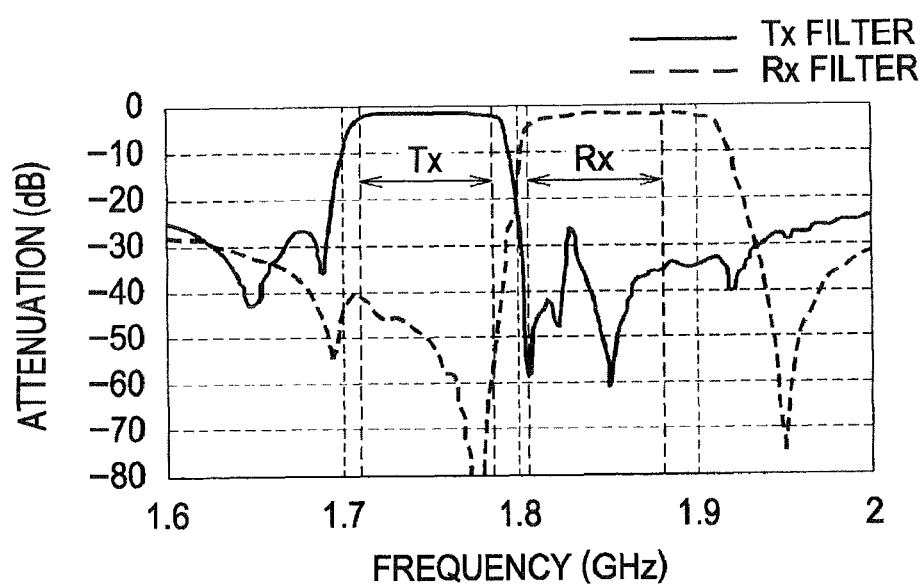
FIGS. 21A and 21B are graphs illustrating various characteristics of a half ladder circuit.
Figure 21B:
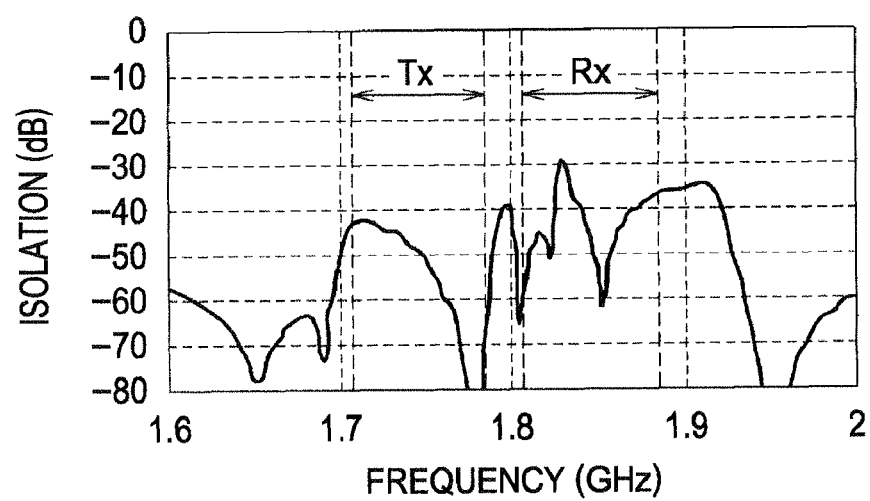

FIG. 16 illustrates a communication module or a communication apparatus including the duplexer according to the above-described embodiment.

FIG. 16 is a diagram FIGS. 15A and 15B are diagrams illustrating a capacitance Ch formed in a die attach chip layer 26 in accordance with aspects of the present invention schematically illustrating the structure of a communication apparatus 40 including the duplexer illustrated in FIG. 1. In FIG. 16, components corresponding to those of the circuit illustrated in FIG. 1 are denoted by the same reference numerals. In the communication apparatus 40 illustrated in FIG. 16, a transmitting filter 3, a receiving filter 1, a balun 2, a power amplifier 42, an RFIC 43, and a baseband IC 44 are provided on a module substrate 41. The receiving filter 1 and the transmitting filter 3 are formed of semiconductor chips. The balun 2 may be formed of, for example, an IPD chip.

The antenna terminal (common terminal) Ant is connected to the transmitting filter 3 and the balun 2, and the balun 2 is connected to the receiving filter 1 by a wiring pattern formed on the module substrate 41. In addition, the antenna terminal Ant is connected to an antenna (not illustrated) of the communication apparatus 40.

A transmitting terminal Tx is connected to the RFIC 43 through the power amplifier 42, and receiving terminals Rx1 and Rx2 are also connected to the RFIC 43. The RFIC 43 is connected to the baseband IC 44. The RFIC 43 includes a semiconductor chip and other parts. The RFIC 43 is an integrated circuit including a receiving circuit that processes received signals input from the receiving terminals Rx1 and Rx2 and a transmitting circuit that processes a transmission signal to be output to the antenna terminal Ant through the power amplifier 42. The power amplifier 42 is a circuit that amplifies the transmission signal output from the transmitting circuit of the RFIC 43 and outputs the amplified signal to the transmitting terminal Tx of the transmitting filter 3.

The baseband IC 44 also includes a semiconductor chip and other parts. The baseband IC 44 is an integrated circuit including a circuit that converts the signal received from the receiving circuit of the RFIC 43 into an audio signal or packet data, and a circuit that converts an audio signal or packet data into a transmission signal and outputs the converted signal to the transmitting circuit of the RFIC 43.

Although not illustrated in the drawings, for example, an output device, such as a speaker or a display, may be connected to the baseband IC 44. The output device may output an audio signal or the packet data converted from the received signal by the baseband IC 44 such that the user of the communication apparatus 40 may recognize the output information. In addition, an input device, such as a microphone or buttons, of the communication apparatus 40 is also connected to the baseband IC 44. The baseband IC 44 converts voice or data input from the user into transmission signals.

The communication apparatus 40 is not limited to that illustrated in FIG. 16. For example, the invention may include a module, which is a set of parts used for a portion of the communication apparatus 40, or a module including the duplexer according to the above-described embodiment.

As described above, according to the embodiment of the invention, it is possible to achieve a ladder balanced-unbalanced filter having a small size and improved the filter characteristics. In the related art, a DMS filter using a SAW device has been used as the balanced-unbalanced filter. However, the voltage resistance or the frequency characteristics of the DMS filter are lower than those of a ladder balanced-unbalanced circuit. Therefore, a unbalanced filter including a ladder filter using an FBAR is required. According to this embodiment, it is possible to achieve a balanced-unbalance filter including a ladder filter using an FBAR.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a illustrating of the superiority and inferiority of the invention. Although the embodiments of the present inventions has been described in detail, it should be understood that the various changes, substitutions, and alterations could be made hereto without departing from the spirit and scope of the invention.

Moreover, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

What is claimed is:

1. A filter comprising:
a first filter unit;
a second filter unit; and
a balun,
wherein the first filter unit includes:
a plurality of series resonators connected in series to each other between a first input terminal and a first output terminal;
a plurality of parallel resonators each having one end connected to a node associated with at least one of the plurality of series resonators between the first input terminal and the first output terminal; and
a common inductance having one end connected to the other ends of at least two of the plurality of parallel resonators and the other end connected to a ground terminal,
the second filter unit includes:

a plurality of series resonators connected in series to each other between a second input terminal and a second output terminal;

a plurality of parallel resonators each having one end connected to a node associated with at least one of the plurality of series resonators between the second input terminal and the second output terminal; and a common inductance having one end connected to the other ends of at least two of the plurality of parallel resonators and the other end connected to the ground terminal, and the balun divides an input signal into two signals having opposite phases and outputs the two signals to the first input terminal and the second input terminal.

2. The filter according to claim 1, wherein the plurality of parallel resonators of the first filter unit further comprises being classified into at least two sets, and one common inductance is connected to the other ends of the parallel resonators in each of the at least two sets, and wherein the plurality of parallel resonators of the second filter unit further comprises being classified into at least two sets, and one common inductance is connected to the other ends of the parallel resonators in each of the at least two sets.

3. The filter according to claim 1, wherein the first filter unit further comprises at least one parallel resonator other than the parallel resonators connected to the common inductance, wherein the second filter unit further comprises at least one parallel resonator other than the parallel resonators connected to the common inductance, and wherein the at least one parallel resonator other than the parallel resonators connected to the common inductance of the first filter unit is connected to the at least one parallel resonator other than the parallel resonators connected to the common inductance of the second filter unit.

4. The filter according to claim 1, wherein the first filter unit further comprises at least one parallel resonator other than the parallel resonators connected to the common inductance, wherein the second filter unit further comprises at least one parallel resonator other than the parallel resonators connected to the common inductance, and wherein the at least one parallel resonator other than the parallel resonators connected to the common inductance of the first filter unit and the second filter unit is common to the first filter unit the second filter unit.

5. The filter according to claim 1, further comprising:

a capacitance that is provided between the first input terminal of the first filter unit and the second output terminal of the second filter unit.

6. The filter according to claim 1, further comprising:

a capacitance that is provided between the first output terminal of the first filter unit and the second input terminal of the second filter unit.

7. The filter according to claim 1, wherein the other ends of all the plurality of parallel resonators of the first filter unit are connected to the first filter unit one common inductance, and the other ends of all the plurality of parallel resonators of the second filter unit are connected to the second filter unit one common inductance.

8. The filter according to claim 1, wherein the series resonators and the parallel resonators of the first filter unit and the second filter unit are provided on a common filter substrate, and the common inductances are formed by transmission lines provided on the filter substrate.

9. The filter according to claim 1, wherein the first filter unit and the second filter unit are formed in a package, and the inductances are provided in the package.

10. The filter according to claim 1, wherein the balun further comprises a circuit using a concentrated constant.

11. The filter according to claim 1, wherein all of the parallel resonators and the series resonators in the first filter and the second filter are surface acoustic wave (SAW) devices or film bulk acoustic resonators (FBARs).

12. A duplexer comprising:

a receiving filter;

a balun; and a transmitting filter, wherein the receiving filter includes:

a first filter unit including a plurality of series resonators connected in series to each other between a first input terminal and a first output terminal, a plurality of parallel resonators each having one end connected to a node associated with at least one of the plurality of series resonators between the first input terminal and the first output terminal, and a common inductance having one end connected to the other ends of at least two of the plurality of parallel resonators and the other end connected to a ground terminal; and a second filter unit including a plurality of series resonators connected in series to each other between a second input terminal and a second output terminal, a plurality of parallel resonators each having one end connected to a node associated with at least one of the plurality of series resonators between the second input terminal and the second output terminal, and a common inductance having one end connected to the other ends of at least two of the plurality of parallel resonators and the other end connected to the ground terminal, wherein the balun divides a signal input from a common terminal into two signals having opposite phases, and outputs the two signals to the first input terminal and the second input terminal of the receiving filter, and the transmitting filter is connected to the common terminal.

13. A communication apparatus comprising:

a first filter unit;

a second filter unit; and a balun, wherein the first filter unit includes:

a plurality of series resonators connected in series to each other between a first input terminal and a first output terminal;

a plurality of parallel resonators each having one end connected to a node associated with at least one of the plurality of series resonators between the first input terminal and the first output terminal; and a common inductance having one end connected to the other ends of at least two of the plurality of parallel resonators and the other end connected to a ground terminal, the second filter unit includes:

a plurality of series resonators connected in series to each other between a second input terminal and a second output terminal;

a plurality of parallel resonators each having one end connected to a node associated with at least one of the plurality of series resonators between the second input terminal and the second output terminal; and a common inductance having one end connected to the other ends of at least two of the plurality of parallel resonators and the other end connected to the ground terminal, and the balun divides an input signal into two signals having opposite phases and outputs the two signals to the first input terminal and the second input terminal.

\* \* \* \* \*